(12) United States Patent
Jeong et al.

(10) Patent No.: US 11,744,078 B2
(45) Date of Patent: Aug. 29, 2023

(54) 3D SEMICONDUCTOR MEMORY DEVICE

(71) Applicant: Samsung Electronics Co., Ltd., Suwon-si (KR)

(72) Inventors: Dawoon Jeong, Hwaseong-si (KR); Youngwoo Kim, Hwaseong-si (KR); Jaesung Kim, Suwon-si (KR); Hyoungryeol In, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 322 days.

(21) Appl. No.: 17/085,715

(22) Filed: Oct. 30, 2020

(65) Prior Publication Data

US 2021/0305270 A1 Sep. 30, 2021

(30) Foreign Application Priority Data

Mar. 31, 2020 (KR) .......................... 10-2020-0039034

(51) Int. Cl.
*H10B 43/50* (2023.01)
*H10B 43/10* (2023.01)
*H10B 43/27* (2023.01)

(52) U.S. Cl.
CPC ............. *H10B 43/50* (2023.02); *H10B 43/10* (2023.02); *H10B 43/27* (2023.02)

(58) Field of Classification Search
CPC ........ H01L 27/11551–11556; H01L 27/11565; H01L 27/11575; H01L 27/11578–11582;

(Continued)

(56) References Cited

U.S. PATENT DOCUMENTS

| 10,050,052 B2 | 8/2018 | Yoon et al. |
| 10,269,820 B1 | 4/2019 | Kaminaga |

(Continued)

FOREIGN PATENT DOCUMENTS

| JP | 4982540 B2 | 7/2012 |
| KR | 10-2014-0137632 A | 12/2014 |

(Continued)

*Primary Examiner* — Robert G Bachner
*Assistant Examiner* — Molly K Reida
(74) *Attorney, Agent, or Firm* — Harness, Dickey & Pierce, P.L.C.

(57) ABSTRACT

A semiconductor device includes a substrate having a first region and a second region, gate electrodes stacked and spaced apart from each other in a first direction, perpendicular to an upper surface of the substrate in the first region and extending in different lengths along a second direction, perpendicular to the first direction in the second region, first separation regions penetrating the gate electrodes in the first and second regions, extending in the second direction, and spaced apart from each other in a third direction, perpendicular to the first and second directions, second separation regions penetrating the gate electrodes in the second region and spaced apart from each other in the second direction between the separation regions, and a first vertical structure penetrating the gate electrodes in the second region and closest to the first region, wherein a width of the second separation regions in the third direction is greater than a width of the first vertical structure, a first end point of the second separation regions adjacent to the first region is spaced apart from a central axis of the first dummy structure in the second direction, away from the first region.

20 Claims, 23 Drawing Sheets

(58) Field of Classification Search
CPC ........ H10B 43/10; H10B 43/20; H10B 43/23; H10B 43/27; H10B 43/50
See application file for complete search history.

(56) References Cited

U.S. PATENT DOCUMENTS

| | | |
|---|---|---|
| 2011/0057250 A1 | 3/2011 | Higashi |
| 2014/0346682 A1 | 11/2014 | Lee et al. |
| 2016/0315089 A1* | 10/2016 | Ito .................... H01L 27/11575 |
| 2016/0343727 A1 | 11/2016 | Kim et al. |
| 2018/0026047 A1 | 1/2018 | Park et al. |
| 2018/0294225 A1* | 10/2018 | Lee .................. H01L 27/11575 |
| 2018/0358375 A1* | 12/2018 | Ku .................... H01L 27/11575 |
| 2018/0374862 A1 | 12/2018 | Lee et al. |
| 2019/0139985 A1* | 5/2019 | Kim .................. H01L 27/11582 |
| 2019/0237475 A1 | 8/2019 | Jung et al. |
| 2021/0272981 A1* | 9/2021 | Jeong ................ H01L 27/11526 |
| 2021/0305276 A1* | 9/2021 | Kim .................... H01L 27/1157 |

FOREIGN PATENT DOCUMENTS

| | | |
|---|---|---|
| KR | 10-2016-0136919 A | 11/2016 |
| KR | 10-2018-0010368 A | 1/2018 |
| KR | 10-2018-0138380 A | 12/2018 |

\* cited by examiner

3D SEMICONDUCTOR MEMORY DEVICE

CROSS-REFERENCE TO RELATED APPLICATION

This application claims benefit of priority to Korean Patent Application No. 10-2020-0039034 filed on Mar. 31, 2020 in the Korean Intellectual Property Office, the disclosure of which is incorporated herein by reference in its entirety.

BACKGROUND

1. Field

The present disclosure relates to a semiconductor device.

2. Description of Related Art

Semiconductor devices are to perform high-capacity data processing with smaller volume. Therefore, it is advantageous to increase the integration of such semiconductor devices. To improve the integration of semiconductor devices, semiconductor devices having a vertical transistor structure instead of an existing planar transistor structure have been proposed.

SUMMARY

An aspect of the present disclosure may provide a semiconductor device having improved integration and/or electrical characteristics.

According to an aspect of the present disclosure, a semiconductor device may include: a substrate having a first region and a second region; a plurality of gate electrodes stacked and spaced apart from each other in a first direction, perpendicular to an upper surface of the substrate in the first region and including a plurality of pad regions provided by some of the plurality of gate electrodes extending by different lengths in a second direction, perpendicular to the first direction in the second region; a plurality of first separation regions penetrating the plurality of gate electrodes in the first and second regions, extending in the second direction, and spaced apart from each other in a third direction, perpendicular to the first and second directions; a plurality of second separation regions penetrating the plurality of gate electrodes between the plurality of first separation regions and including second main separation regions extending in the second direction, from the first region, and second auxiliary separation regions extending in the second direction, from the second region; and a plurality of channel structures penetrating the plurality of gate electrodes, extending vertically on the substrate, and arranged in the first region and a plurality of dummy channel structures penetrating the plurality of gate electrodes, extending vertically on the substrate, and arranged in the second region, wherein the plurality of pad regions include first pad regions provided by an uppermost first gate electrode among the plurality of gate electrodes and second pad regions provided by a second gate electrode below the first gate electrode, the plurality of dummy channel structures include a pair of first dummy channel structures penetrating the first pad regions and arranged adjacent to the first region and a pair of second dummy channel structures arranged adjacent to a first end of the first gate electrode, the plurality of second auxiliary separation regions are arranged between the first pad regions adjacent to each other and have a first edge portion adjacent to the first dummy channel structure and a first end closest to the first region on the first edge portion, a central axis of the first dummy channel structure is spaced apart from a central axis of the second dummy channel structure by a first distance in the second direction, and the first edge portion of the second auxiliary separation regions is spaced apart from a central axis of the first dummy channel structure by a second distance, smaller than the first distance, in the second direction.

According to an aspect of the present disclosure, a semiconductor device may include: a substrate having a first region and a second region; gate electrodes stacked and spaced apart from each other in a first direction, perpendicular to an upper surface of the substrate in the first region and including pad regions provided by some of the plurality of gate electrodes extending in a second direction, perpendicular to the first direction in the second region and having different lengths; first separation regions penetrating the gate electrodes in the first and second regions, extending in the second direction, and spaced apart from each other in a third direction, perpendicular to the first and second directions; second separation regions penetrating the gate electrodes in the second region and extending in the second direction; and channel structures and dummy channel structure penetrating the gate electrodes, extending vertically on the substrate, and arranged in the first region and second region, respectively, wherein the pad regions include a first pad region and a second pad region sequentially arranged in the second direction from the first region, a first edge portion adjacent to the first region of the second separation regions is spaced apart from a central axis of the dummy channel structures penetrating the first pad region and adjacent to the first edge portion by a first distance in the second direction, and the first distance is greater than a maximum width of the dummy channel structure.

According to another aspect of the present disclosure, a semiconductor device may include: a substrate having a first region and a second region; gate electrodes stacked and spaced apart from each other in a first direction, perpendicular to an upper surface of the substrate in the first region and extending in a second direction, perpendicular to the first direction in the second region and having different lengths; first separation regions penetrating the gate electrodes in the first and second regions, extending in the second direction, and spaced apart from each other in a third direction, perpendicular to the first and second directions; second separation regions penetrating the gate electrodes in the second region and spaced apart from each other in the second direction between the separation regions; and a first vertical structure penetrating the gate electrodes in the second region and closest to the first region, wherein a width of the second separation regions in the third direction is greater than a width of the first vertical structure, and a first end of the second separation regions adjacent to the first region is spaced apart from a central axis of the first dummy structure in the second direction, away from the first region.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, example embodiments in the present disclosure will be described in detail with reference to the accompanying drawings.

Figure 1:
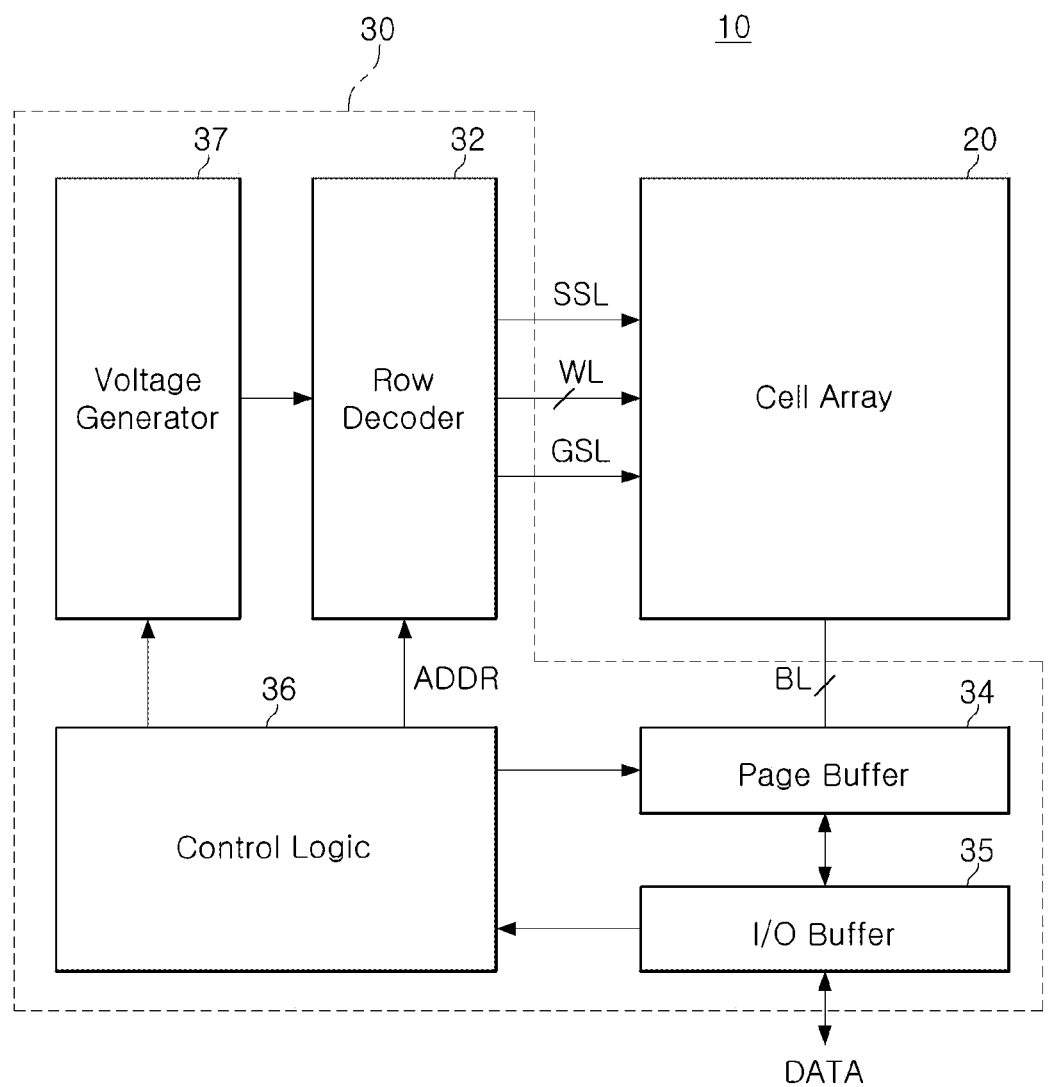
FIG. 1 is a schematic block diagram of a semiconductor device according to example embodiments in the present disclosure.

FIG. 1 is a schematic block diagram of a semiconductor device according to example embodiments.

Referring to FIG. 1, a semiconductor device 10 may include a memory cell array 20 and/or a peripheral circuit 30. The peripheral circuit 30 may include a row decoder 32, a page buffer 34, an input/output (I/O) buffer 35, a control logic 36, and/or a voltage generator 37.

The memory cell array 20 includes a plurality of memory blocks, and each memory block may include a plurality of memory cells. The plurality of memory cells may be connected to the row decoder 32 through a string select line (SSL), a word line (WL), and/or a ground select line (GSL) and connected to the page buffer 34 through a bit line (BL). In example embodiments, a plurality of memory cells arranged in the same row may be connected to the same word line WL, and a plurality of memory cells arranged in the same column may be connected to the same bit line BL.

The row decoder 32 decodes an input address ADDR to generate and transmit driving signals of the word line WL. The row decoder 32 may provide a word line voltage generated by the voltage generator 37 to each of a selected word line WL and unselected word lines WL in response to control of the control logic 36.

The page buffer 34 may be connected to the memory cell array 20 through the bit lines BL to read data stored in the memory cells. The page buffer 34 may temporarily store data to be stored in the memory cells or detect data stored in the memory cells according to an operation mode. The page buffer 34 may include a column decoder and/or a detection amplifier. The column decoder may selectively activate the bit lines BL of the memory cell array 20, and the detection amplifier may detect a voltage of a bit line BL selected by the column decoder to read data stored in the selected memory cell during a read operation.

The I/O buffer 35 may receive data DATA and deliver the data DATA to the page buffer 34 during a programming operation and output the data DATA received from the page buffer 34 to the outside during a read operation. The I/O buffer 35 may deliver an input address or command to the control logic 36.

The control logic 36 may control the operation of the row decoder 32 and/or the page buffer 34. The control logic 36 may receive a control signal and an external voltage transferred from the outside and operate according to the received control signal. The control logic 36 may control read, write, and/or erase operations in response to the control signals.

The voltage generator 37 may generate voltages required for an internal operation, for example, a program voltage, a read voltage, an erase voltage, and the like using an external voltage. The voltages generated by the voltage generator 37 may be delivered to the memory cell array 20 through the row decoder 32.

Any of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Figure 2:
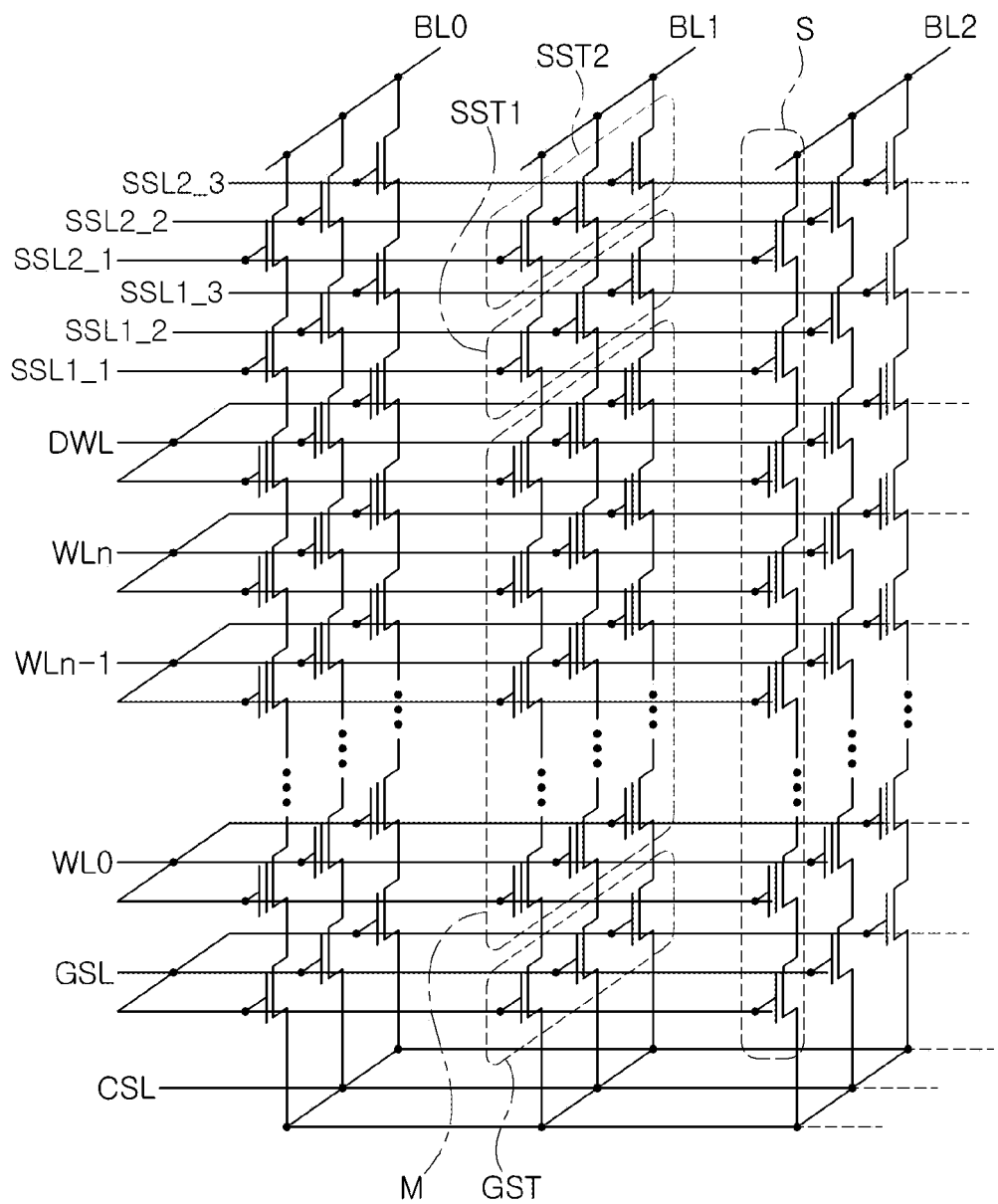
FIG. 2 is an equivalent circuit diagram of a cell array of a semiconductor device according to example embodiments in the present disclosure.

FIG. 2 is an equivalent circuit diagram of a cell array of a semiconductor device according to example embodiments.

Referring to FIG. 2, the memory cell array 20 may include memory cells M connected to each other in series and a plurality of memory cell strings S including a ground select transistor GST and string select transistors SST1 and SST2 connected in series to opposing ends of the memory cells M. The plurality of memory cell strings S may be connected to bit lines BL0 to BL2 in parallel. The plurality of memory cell strings S may be commonly connected to the common source line CSL. That is, the plurality of memory cell strings S may be arranged between the plurality of bit lines BL0 to BL2 and one common source line CSL. In some example embodiments, a plurality of common source lines CSL may be arranged two-dimensionally.

The memory cells M connected to each other in series may be controlled by the word lines WL0 to WLn for selecting the memory cells M. Each memory cell M may include a data storage element. Gate electrodes of the memory cells M arranged at the same or substantially the same distance from the common source line CSL may be commonly connected to one of the word lines WL0 to WLn so as to be in an equipotential state. Alternatively, even if the gate electrodes of the memory cells M are arranged at the same or substantially the same distance from the common source lines CSL, gate electrodes arranged in different rows or columns may be independently controlled.

The ground select transistor GST may be controlled by the ground select line GSL and may be connected to the common source line CSL. The string select transistors SST1 and SST2 may be controlled by string select lines SSL1_1, SSL1_2, SSL1_3, SSL2_1, SSL2_2, and SSL2_3 and may be connected to the bit lines BL0 to BL2. FIG. 2 illustrates a structure in which one ground select transistor GST and two string select transistors SST1 and SST2 are connected to a plurality of memory cells M connected to each other in series, but each of the string select transistors SST1 and SST2 may be connected or a plurality of ground select transistors GST may be connected. One or more dummy lines DWL or buffer lines may be further arranged between the uppermost word line WLn among the word lines WL0 to WLn and the string select lines SSL1_1, SSL1_2, SSL1_3, SSL2_1, SSL2_2, and SSL2_3. In some example embodiments, one or more dummy lines DWL may be arranged between the lowermost word line WL0 and the ground select line GSL.

When a signal is applied to the string select transistors SST1 and SST2 through the string select lines SSL1_1, SSL1_2, SSL1_3, SSL2_1, SSL2_2, and SSL2_3, the applied signal is transferred to the memory cells M connected in series through the bit lines BL0 to BL2, thereby performing data read and writing operations. Further, an erase operation to erase data written in the memory cells M may be performed by applying a predetermined or alternatively, desired erase voltage through the substrate. In some example embodiments, the memory cell array 20 may include at least one dummy memory cell string which is electrically separated from the bit lines BL0 to BL2.

Figure 3A:
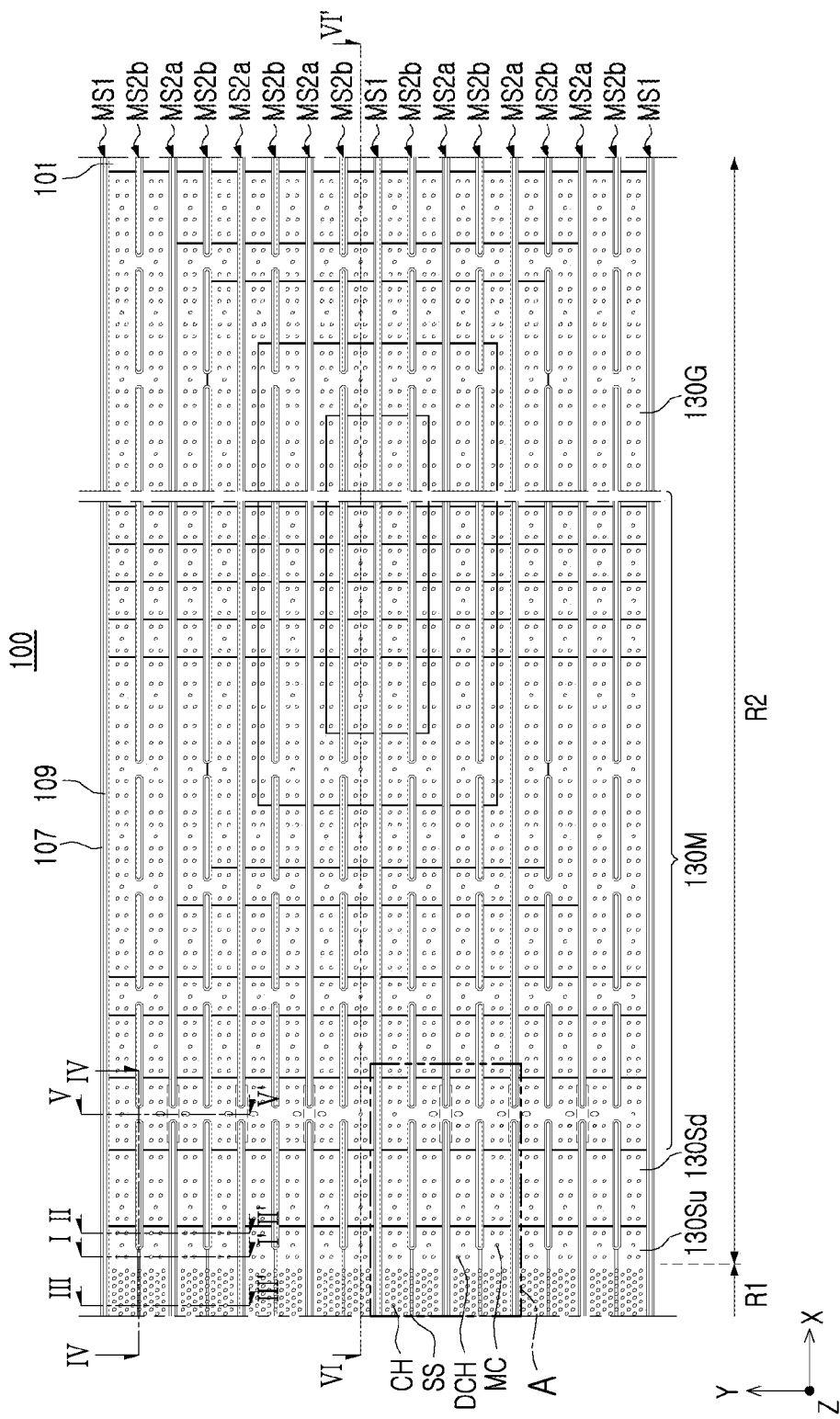
FIG. 3A is a schematic plan view of a semiconductor device according to example embodiments in the present disclosure.
Figure 3B:
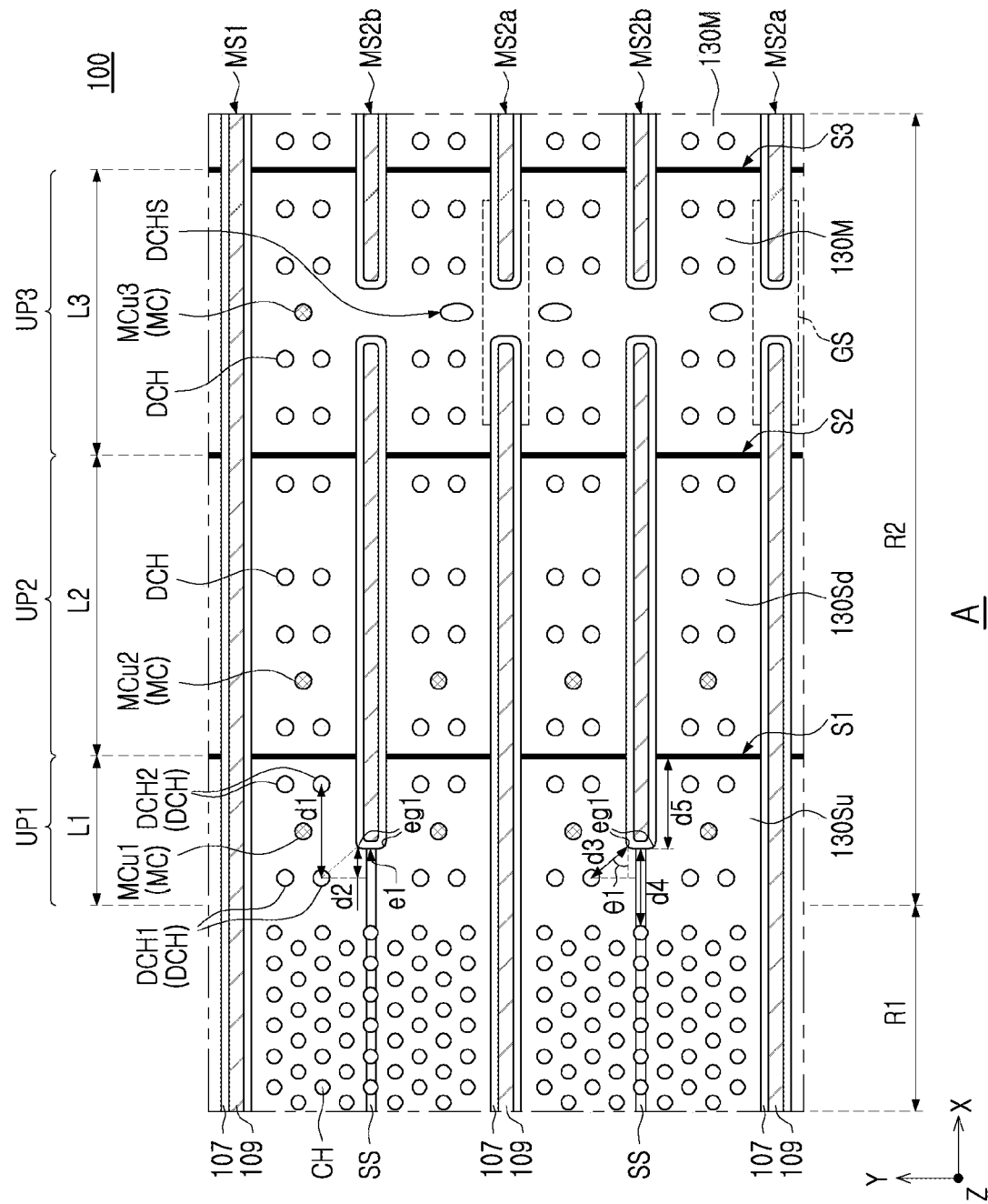
FIG. 3B is a partially enlarged plan view of enlarged portion 'A' in FIG. 3A.
Figure 4A:
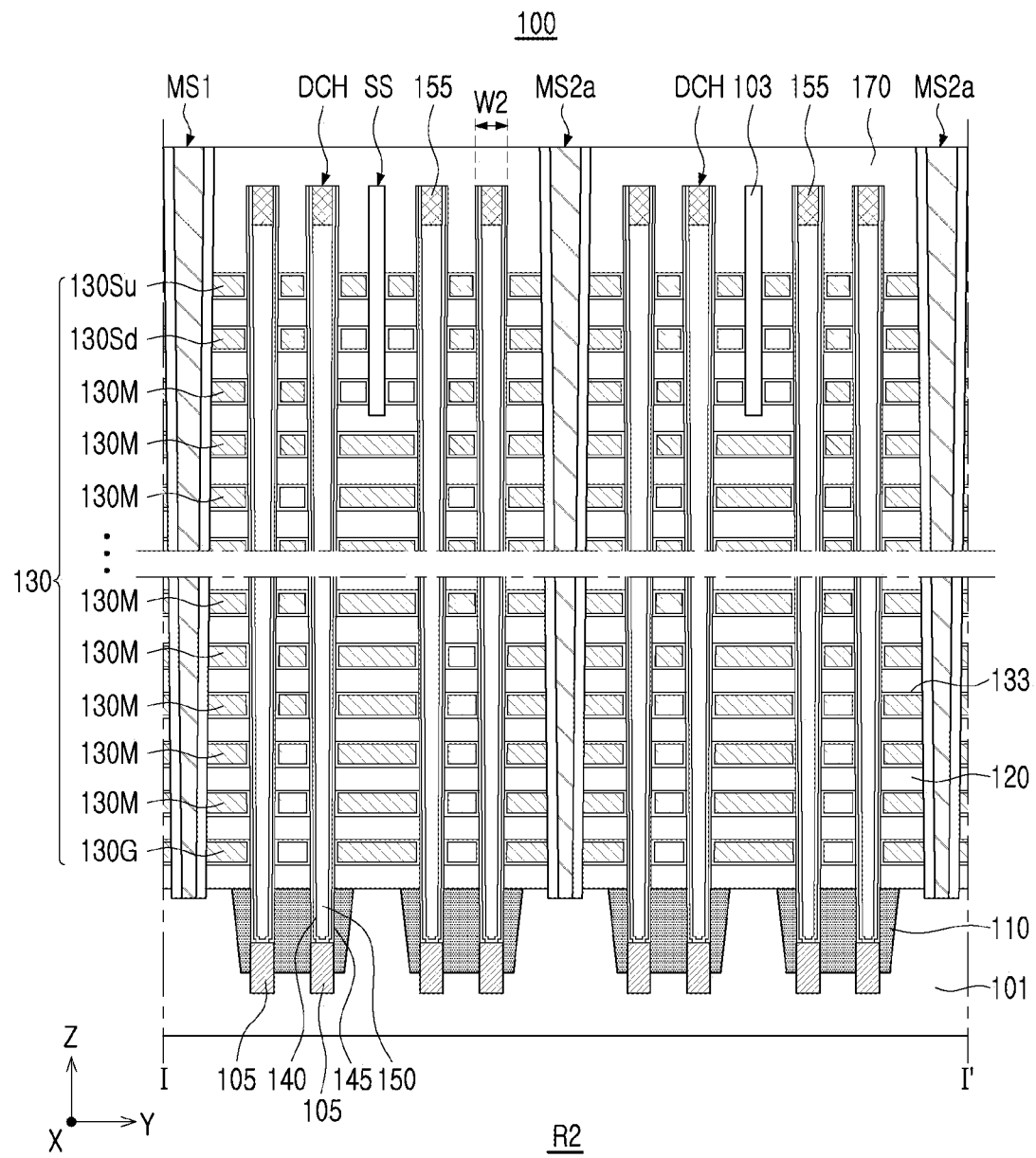
FIGS. 4A to 4F are cross-sectional views illustrating an example of a semiconductor device according to example embodiments in the present disclosure.
Figure 4B:
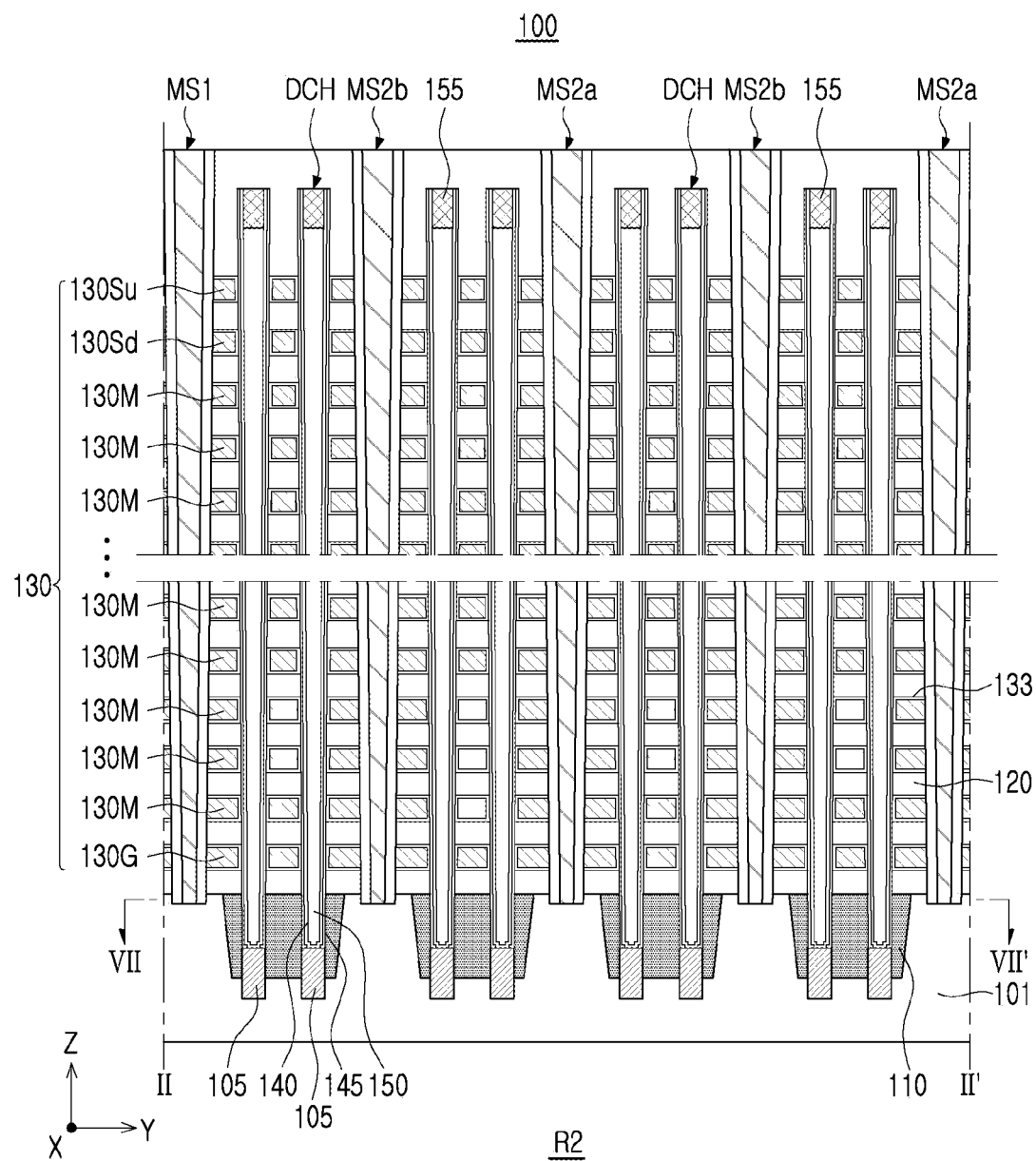
Figure 4C:
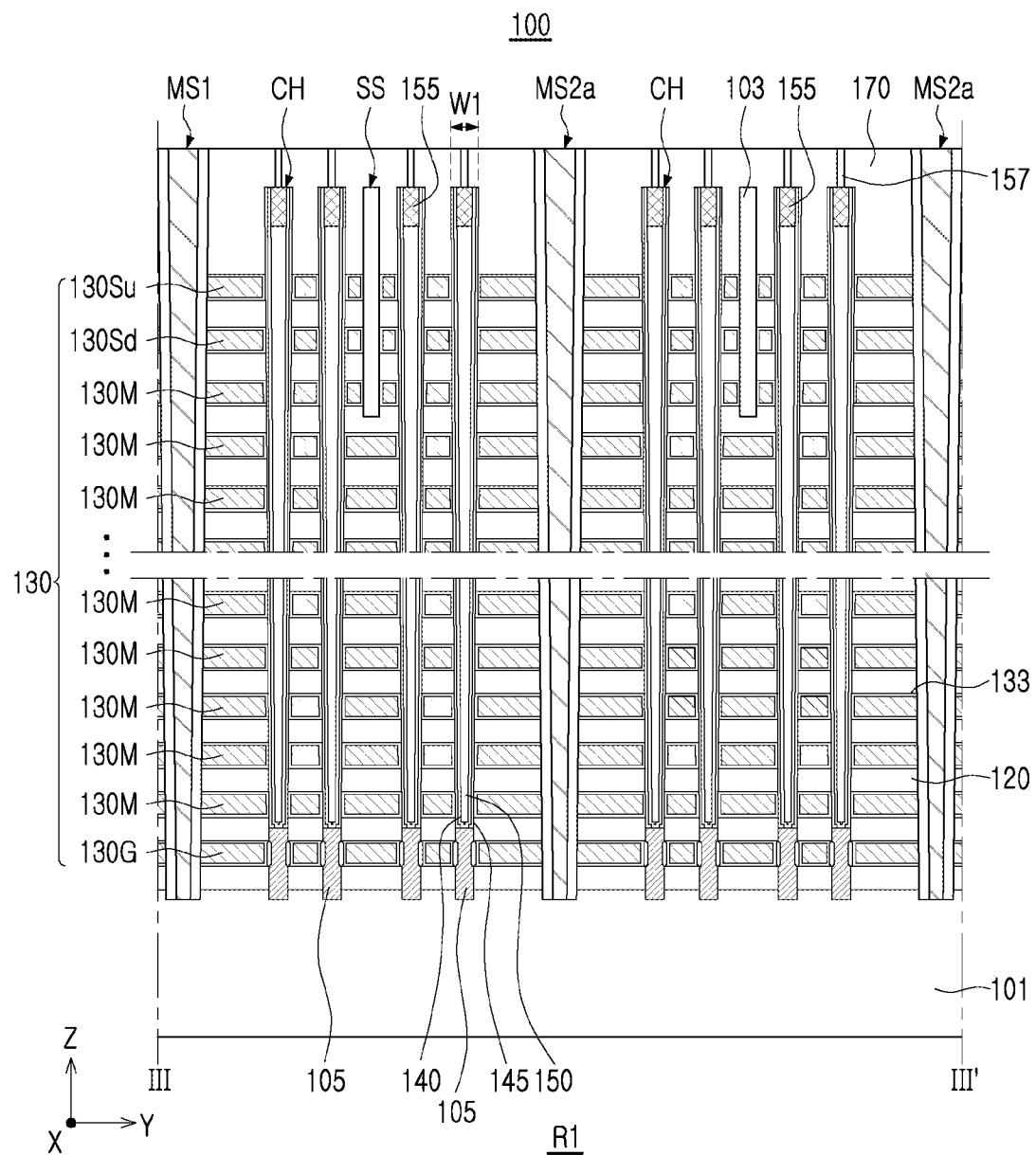
Figure 4D:
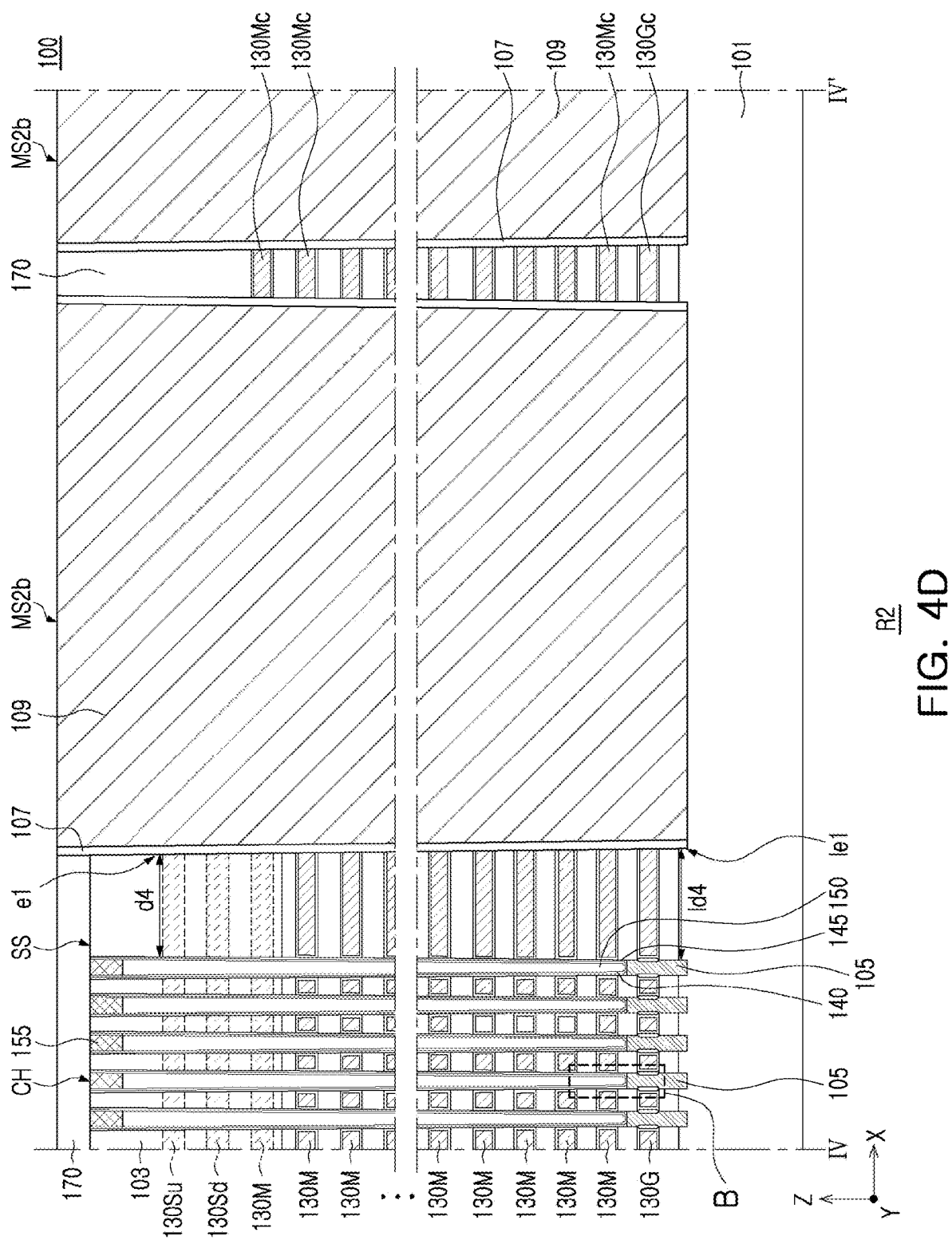
Figure 4E:
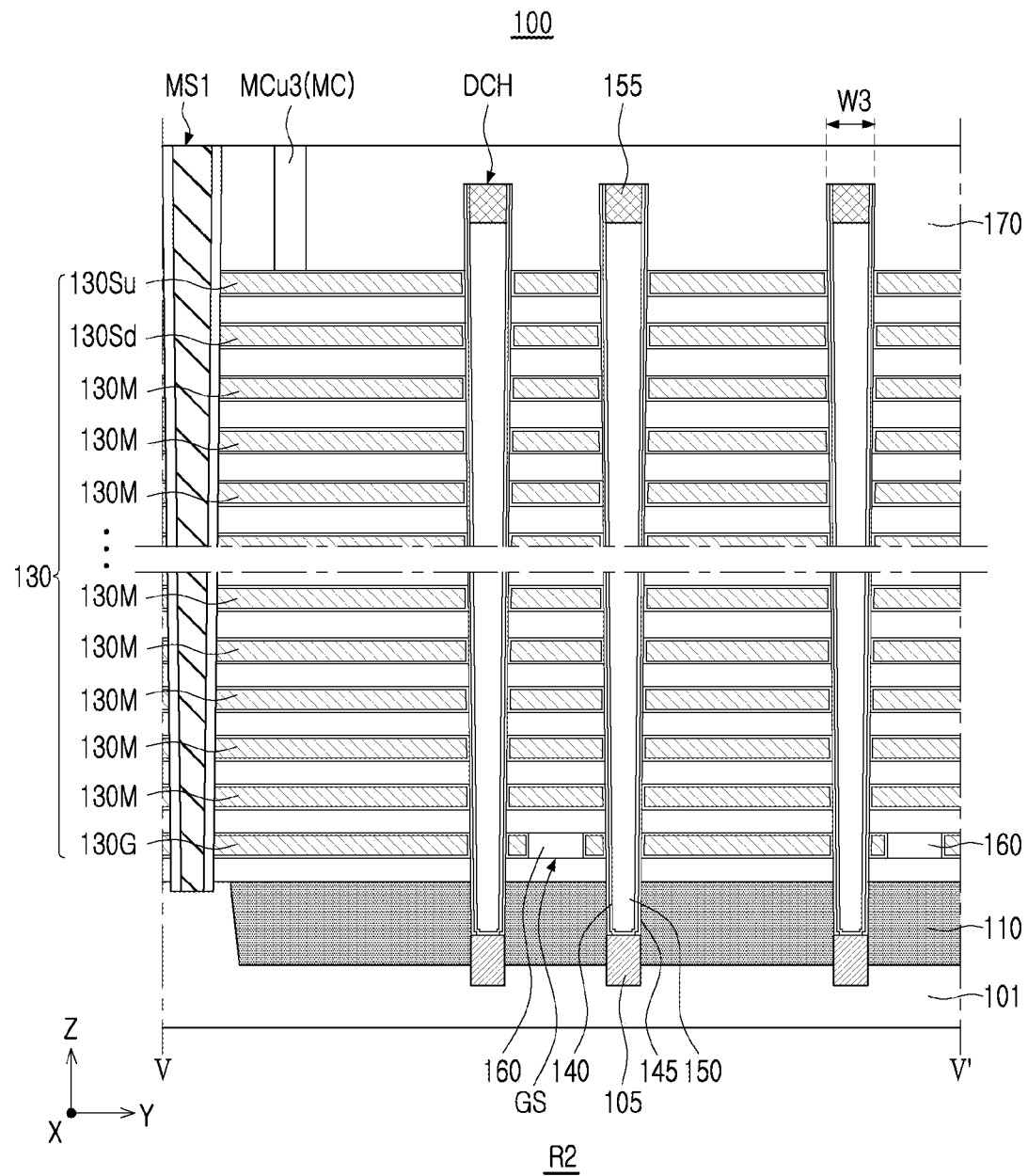

FIG. 3A is a schematic plan view of a semiconductor device according to example embodiments in the present disclosure and FIG. 3B is a partially enlarged plan view of an enlarged portion 'A' in FIG. 3A. FIGS. 4A to 4F are cross-sectional views taken along lines I-I', II-II', III-III', IV-IV', V-V', and VI-VI' of FIG. 3A, respectively, and FIG. 4G is a partially enlarged plan view of an enlarged portion 'B' in FIG. 4D. The portion 'A' in FIG. 3A may be a portion including the same pattern as the portions indicated by lines I-I', II-II', III-III', IV-IV' and V-V' in FIG. 3A.

Referring to FIGS. 3A to 4G, the semiconductor device 100 according to example embodiments may include a substrate 101 having a first region R1 and/or a second region R2, a substrate insulating layer 110 disposed in the substrate 101 at the second region R2, gate electrodes 130 stacked on the substrate 101, channel structures CH and dummy channel structures DCH disposed to penetrate the gate electrodes 130, first and second separation regions MS1, MS2a, and MS2b extending through the gate electrodes 130, upper separation regions SS penetrating a portion of the uppermost gate electrode 130, and lower separation regions GS penetrating a portion of the lowermost gate electrode 130. The channel structures CH may include a channel layer 140, a gate dielectric layer 145, a channel insulating layer 150, and/or a channel pad 155. The semiconductor device 100 may further include interlayer insulating layers 120 alternately stacked with the gate electrodes 130 on the substrate 101, a cell region insulating layer 170, and/or contact plugs MC.

The first region R1 of the substrate 101 may be a region in which the gate electrodes 130 are vertically stacked and the channel structures CH are disposed, and may be a region corresponding to the memory cell array 20 of FIG. 1. The first region R1 may be referred to as a memory cell array region. The second region R2 of the substrate 101 may be a region in which the gate electrodes 130 extend to have different lengths and the dummy channel structures DCH are disposed, which may correspond to a region electrically connecting the memory cell array 20 and the peripheral circuit 30 of FIG. 1. The second region R2 may be referred to as a connecting region. The second region R2 may be disposed in at least one end of the first region R1 in at least one direction, for example, an x direction.

The substrate 101 may have an upper surface extending in the x direction and a y direction. The substrate 101 may include a semiconductor material, for example, a group IV semiconductor, a group III-V compound semiconductor, or a group II-VI oxide semiconductor. For example, the group IV semiconductor may include silicon, germanium or silicon-germanium. The substrate 101 may be provided as a bulk wafer or an epitaxial layer.

Figure 5:
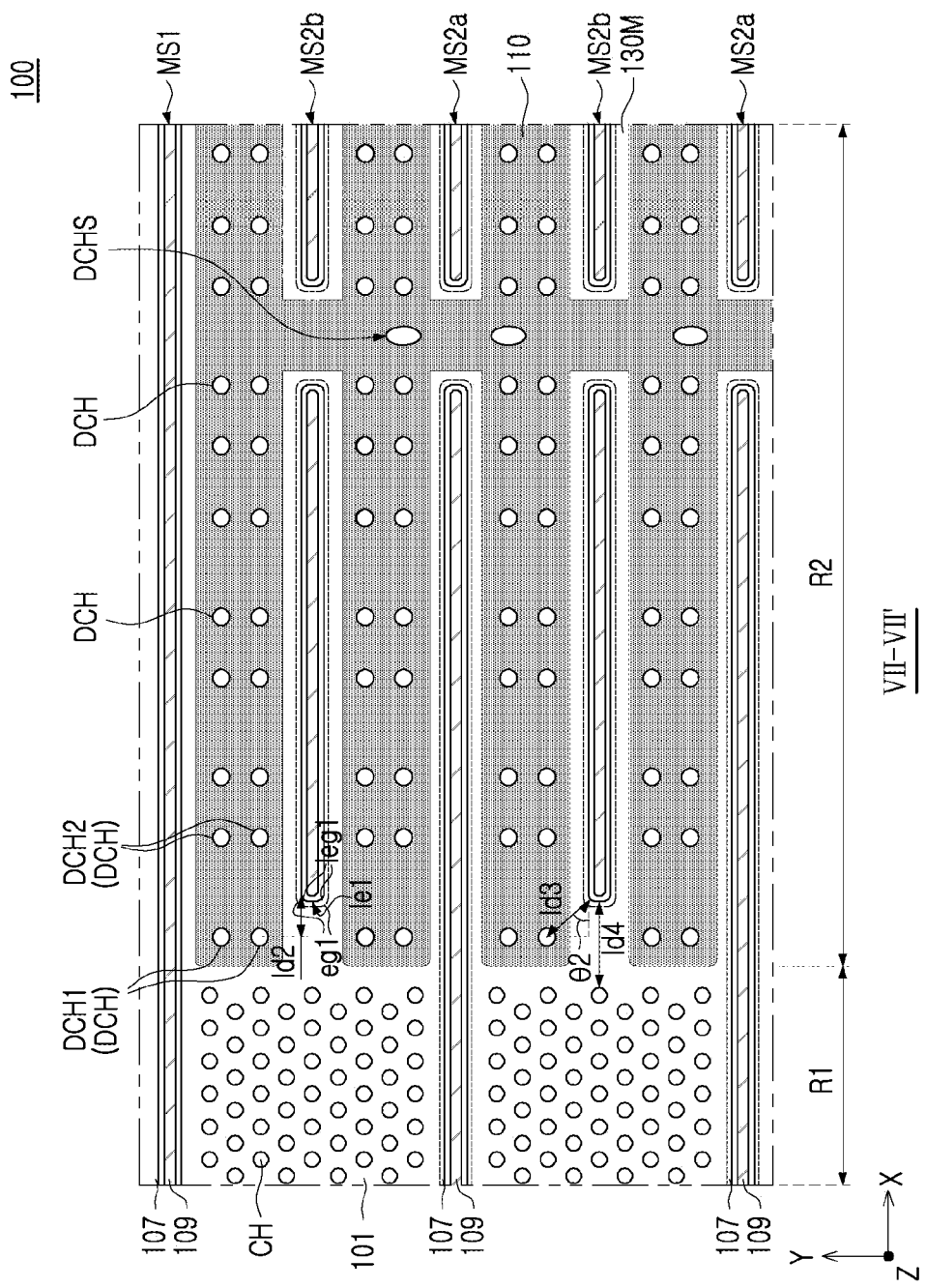
FIG. 5 is a schematic cross-sectional view of a semiconductor device according to example embodiments in the present disclosure.

The substrate insulating layer 110 may be disposed in the substrate 101 in the second region R2 of the substrate 101. As shown in FIGS. 4A, 4B, and 5, the substrate insulating layer 110 may be disposed between the first separation regions MS1 and the second separation regions MS2a and MS2b so as not to overlap the first separation regions Ms1 and the second separation regions MS2a and MS2b in a z direction in the second region R2. The substrate insulating layer 110 may extend to a region in which the second separation regions MS2a and MS2b are spaced apart from each other in the x direction. According to example embodiments, the substrate insulating layer 110 may not extend to the region in which the second separation regions MS2a and MS2b are spaced apart from each other in the x direction.

The substrate insulating layer 110 may be formed by, for example, shallow trench separation (STI). The substrate insulating layer 110 may extend from an upper surface of the substrate 101 into the substrate 101 by a predetermined or alternatively, desired depth. The substrate insulating layer 110 may be formed of an insulating material and may include, for example, oxide, nitride, or a combination thereof. The substrate insulating layer 110 may also be described as configuring an insulating region of the substrate 101. In some example embodiments, the substrate 101 may include an insulating region corresponding to the substrate insulating layer 110 and a conductive region based on a semiconductor region.

The gate electrodes 130 are vertically spaced apart from each other on the first region R1 and may be extended from the first region R1 to the second region R2 in different lengths.

The gate electrodes 130 may include a ground select gate electrode 130G constituting a gate of the ground select transistor GST, memory cell gate electrodes 130M constituting the plurality of memory cells M, and the string select gate electrodes 130Sd and 130Su constituting gates of the string select transistors SST1 and SST2 of FIG. 2. The number of memory cell gate electrodes 130M constituting the memory cells M may be determined according to capacity of the semiconductor device 100. According to some example embodiments, the string select gate electrodes 130Sd and 130Su and the ground select gate electrode 130G may be one or two or more, respectively, and may have a structure which is the same as or different from the gate electrodes 130 of the memory cells M. Some gate electrodes 130, for example, the memory cell gate electrodes 130M adjacent to the ground select gate electrodes 130G and the string select gate electrodes 130Sd and 130Su may be dummy gate electrodes.

As illustrated in FIGS. 3A and 3B, the gate electrodes 130 may be disposed to be separated in a predetermined or alternatively, desired unit in the y direction by the first separation regions MS1 extending in the x direction. The gate electrodes 130 between a pair of first separation regions MS1 may form one memory block, but a range of the memory block is not limited thereto.

The memory cell gate electrodes 130M may form one layer in one memory block. Each of the memory cell gate electrodes 130M may include eight sub-gate electrodes extending in the x direction between the pair of first separation regions MS1 and may be connected by gate connecting portions (see 130Mc in FIG. 4D) so as to be disposed as a single layer in a region in which the second separation regions MS2a and MS2b are spaced apart from each other in the x direction. The gate connecting portions refer to a region in which the gate electrodes 130 are horizontally connected at the same level.

The string select gate electrodes 130Sd and 130Su may be completely separated into eight sub-gate electrodes by first and second separation regions MS1, MS2a and MS2b and the upper separation region SS between the pair of first separation regions MS1.

The ground select gate electrodes 130G may be connected by the gate connecting portions between some of the second separation regions MS2a and MS2b but may be separated into four sub-gate electrodes by the second main separation regions MS2a and the lower separation region GS between the second main separation regions MS2a.

Figure 4F:
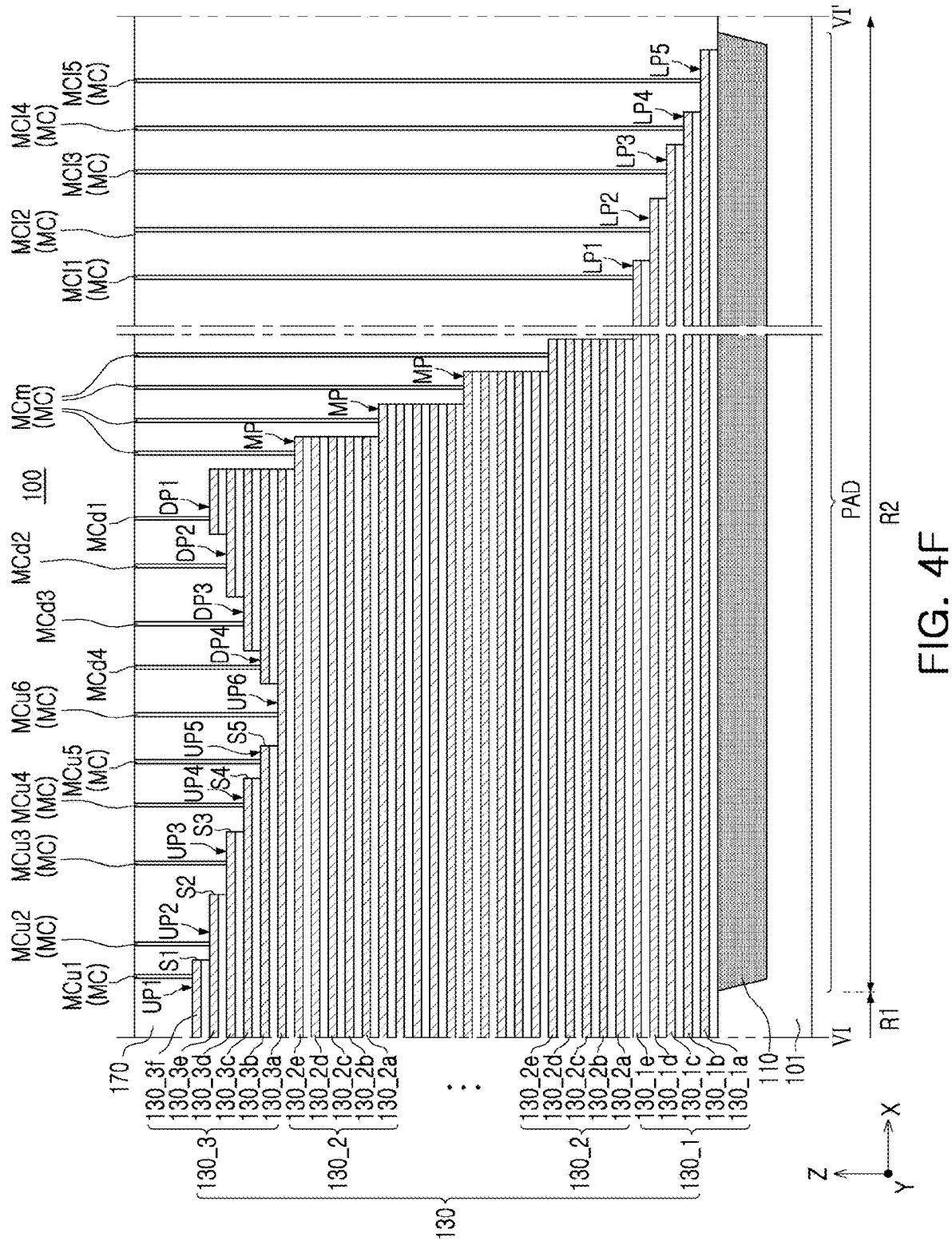
Figure 4G:
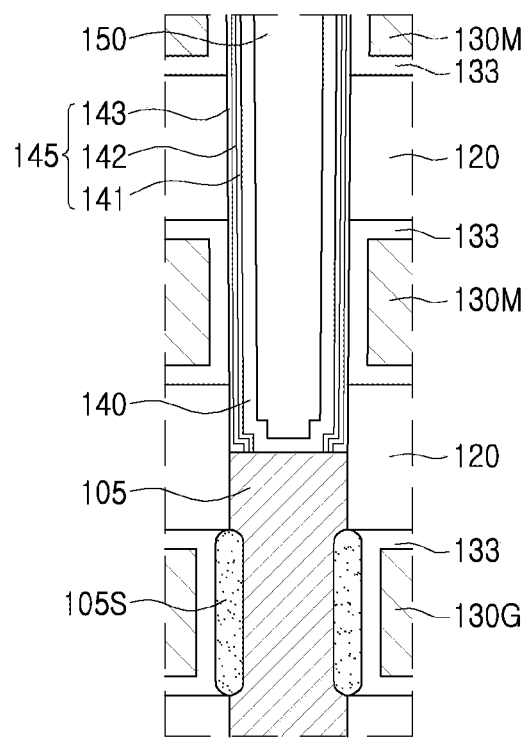
FIG. 4G is a partially enlarged cross-sectional view of enlarged portion 'B' in FIG. 4D.

As illustrated in FIGS. 3A and 4F, the gate electrodes 130 in the second region R2 of the substrate 101 extend by different lengths in the x direction to form steps and provide a pad region PAD in which the lower gate electrode 130 is exposed upward. In this disclosure, the pad region PAD may be used as a term referring to the entire area in which the gate electrodes 130 form steps in the second region R2. A predetermined or alternatively, desired number of gate electrodes 130, for example, one, two, four, or five gate electrodes 130 may form a gate group, and a step structure may be formed between the gate groups in the x direction. For example, as illustrated in FIG. 4F, one gate group may include five gate electrodes 130, and a step structure may be formed between the gate groups in the x direction. The gate electrodes 130 constituting one gate group may be disposed to have a step structure with each other in the y direction as well.

In some example embodiments, the pad regions PAD may include a first upper pad region UP1, a second upper pad region UP2, and/or a third upper pad region UP3 sequentially disposed in the x direction from one end of the first region R1 toward the second region R2. The first upper pad region UP1, the second upper pad region UP2, and/or the third upper pad region UP3 may be provided by three gate electrodes 130 sequentially stacked from the top of the gate electrodes 130. For example, the first upper pad region UP1 may be provided by the uppermost gate electrode 130Su in the second region R2, and the second upper pad region UP2 may be provided by the gate electrode 130Sd disposed under the uppermost gate electrode 130Su in the second region R2.

In some example embodiments, a plurality of first upper pad regions UP1 may be disposed and spaced apart from each other in the y direction. The first upper pad regions UP1 may be separated by the upper separation region SS and the second auxiliary separation region MS2b and may be separated by the first separation region MS1 and the second main separation region MS2a.

In some example embodiments, the first upper pad region UP1, the second upper pad region UP2, and/or the third upper pad region UP3 may have a first length L1, a second length L2, and/or a third length L3 different in the x direction, respectively, but are not limited thereto.

Each of the gate electrodes 130 may be exposed upward from the pad regions PAD and connected to the contact plugs MC, whereby the gate electrodes 130 may be connected to an upper wiring structure. In the pad regions PAD, the gate electrodes 130 may have a thicker region to be stably connect to the contact plugs MC, but are not limited thereto.

The gate electrodes 130 may include a metal such as tungsten (W). According to some example embodiments, the gate electrodes 130 may include polycrystalline silicon or a metal silicide material.

In some example embodiments, the gate electrodes 130 may include an internal gate conductive layer and/or a diffusion barrier 133 surrounding the gate conductive layer. The diffusion barrier 133 may include, for example, tungsten nitride (WN), tantalum nitride (TaN), titanium nitride (TiN), or a combination thereof.

In some example embodiments, the semiconductor device 100 may further include an erase gate electrode forming an erase transistor disposed above the string select gate electrodes 130Su and 130Sd or below the ground select gate electrodes 130G and used in an erase operation using a gate induced drain leakage (GIDL).

The interlayer insulating layers 120 may be disposed between the gate electrodes 130. The interlayer insulating layers 120 may be disposed to be spaced apart from each other in a direction perpendicular to the upper surface of the substrate 101 and extend in the x direction, like the gate electrodes 130. The interlayer insulating layers 120 may include an insulating material such as silicon oxide or silicon nitride.

The channel structures CH may be disposed spaced apart from each other while forming a row and a column on the first region R1. The channel structures CH may be arranged to form a lattice pattern or may be arranged in a zigzag form in one direction. The channel structures CH may extend vertically on the substrate 101. The channel structures CH may have a column shape and/or may have an inclined side surface narrower toward the substrate 101 according to an aspect ratio. Some of the channel structures CH adjacent to the second region R2, among the channel structures CH arranged in the first region R1, may be dummy channels. Also, the channel structures CH overlapping the upper separation regions SS may be dummy channels. In some example embodiments, the dummy channels may have a structure the same as or similar to the channel structures CH but may not perform a substantial function in the semiconductor device 100.

Referring to FIGS. 4D and 4G, a channel layer 140 may be disposed in the channel structures CH. The channel layer 140 in the channel structures CH may be formed in an annular shape surrounding the internal channel insulating layer 150, but according to some example embodiments, the channel layer 140 may have a columnar shape such as a cylindrical or prismatic shape without the channel insulating layer 150. The channel layer 140 may be connected to an epitaxial layer 105 at the bottom, and an insulating layer may be further disposed between the channel layer 140 and the epitaxial layer 105. The channel layer 140 may include a semiconductor material such as polycrystalline silicon or monocrystalline silicon. The semiconductor material may be an undoped material or a material containing p-type or n-type impurities. Channel structures CH disposed on a straight line in the y direction may be connected to different bit lines BL0 to BL2 (see FIG. 2) according to an arrangement of an upper wiring structure connected to the channel pad 155.

The channel pads 155 may be disposed on the channel layer 140 in the channel structures CH. The channel pads 155 may be disposed to cover an upper surface of the channel insulating layer 150 and to be electrically connected to the channel layer 140. The channel pads 155 may include, for example, doped polycrystalline silicon.

The gate dielectric layer 145 may be disposed between the gate electrodes 130 and the channel layer 140. The gate dielectric layer 145 may include a tunneling layer 141, a data storage layer 142, and/or a blocking layer 143 sequentially stacked from the channel layer 140. The tunneling layer 141 may tunnel charges to the data storage layer 142 and may include, for example, silicon oxide ($SiO_2$), silicon nitride ($Si_3N_4$), silicon oxynitride (SiON), or a combination thereof. The data storage layer 142 may be a charge trap layer or a floating gate conductive layer. The blocking layer 143 may include silicon oxide ($SiO_2$), silicon nitride ($Si_3N_4$), silicon oxynitride (SiON), a high-k dielectric material, or a combination thereof. In some example embodiments, at least a portion of the gate dielectric layer 145 may extend in a horizontal direction along the gate electrodes 130.

The epitaxial layer 105 may be disposed on the substrate 101 at a lower end of the channel structures CH and may be disposed on a side surface of the at least one gate electrode 130. The epitaxial layer 105 may be disposed in a recessed region of the substrate 101. A height of an upper surface of the epitaxial layer 105 may be higher than an upper surface of the lowermost gate electrode 130 and lower than a lower surface of the upper gate electrode 130, but is not limited to that illustrated. In some example embodiments, the epitaxial layer 105 may be omitted, in which case the channel layer 140 may be directly connected to the substrate 101.

A channel contact plug 157 may be disposed on the channel structures CH. The channel contact plug 157 may be connected to the channel pads 155. The channel contact plug 157 may connect the channel structures CH to an upper wiring structure and may be connected to each of the bit lines BL0 to BL2 (see FIG. 2). The channel contact plug 157 may not be disposed on the dummy channel structure DCH. Alternatively, the contact plug 157 may be disposed on the dummy channel structure DCH and may not be connected to the upper wiring structure. The channel contact plug 157 may not be disposed on the dummy channel structure DCH overlapping the dummy channels or the upper separation region SS among the channel structures CH.

The dummy channel structures DCH may be disposed in the second region R2, may have a structure which is the same or similar to the channel structures CH, but may not perform a substantial function in the semiconductor device 100. For example, the dummy channel structures DCH may be connected to the substrate 101 through the substrate insulating layer 110. The dummy channel structures DCH may be regularly arranged in columns and rows in the pad regions PAD of the gate electrodes 130. The dummy channel structures DCH may have a maximum diameter which is a second width W2 greater than a first width W1 which is a maximum diameter of the channel structures CH.

When a minimum unit surrounded by the first and second separation regions MS1, MS2a, and MS2b in the pad regions PAD is a unit pad region, the dummy channel structures DCH may be arranged at four corners of one unit pad region. However, a length of each unit pad region may be different for each gate electrode 130, and the number and/or spacing of dummy channel structures DCH arranged in each unit pad region may also be different.

The dummy channel structures DCH may include a support channel structure DCHS disposed outside the lower separation region GS in the y direction. The support channel structure DCHS may be disposed on both sides of the lower separation region GS in the y direction. The support channel structure DCHS may have a maximum diameter greater than a maximum diameter of the channel structures CH and the dummy channel structures DCH. For example, the support channel structure DCHS may have a maximum diameter which is a third width W3 greater than the first width W1 which is a maximum diameter of the channel structures CH.

Compared to the channel structures CH and the dummy channel structures DCH having a circular or near-circular shape, the support channel structures DCHS may have a shape in which a width in the y direction is greater than a width in the x direction. The support channel structures DCHS may have an elongated, oblong, or elliptical shape that extends in the y direction.

The dummy channel structures DCH may be arranged regularly. Since the dummy channel structures DCH are arranged to penetrate the substrate insulating layer 110, a lower end thereof may be positioned to be lower height than a lower end of the channel structures CH. Accordingly, the dummy channel structures DCH may have a height higher than the channel structures CH. In addition, the epitaxial layers 105 in the dummy channel structures DCH may be arranged such that at least a portion of the side surface is surrounded by the substrate insulating layer 110.

As illustrated in FIG. 3B, the dummy channel structures DCH may be disposed adjacent to four corners of the first upper pad region UP1 provided by the uppermost gate electrode 130Su. The dummy channel structures DCH may include a pair of the first dummy channel structures DCH1 penetrating the first upper pad region UP1 and arranged adjacent to the first region R1 and a pair of the second dummy channel structures DCH2 adjacent to a first end S1 of the uppermost gate electrode 130Su. The first end S1 may also be referred to as an end of the first upper pad region UP1. A central axis of the first dummy channel structure DCH1 may be spaced apart from a central axis of the second dummy channel structure DCH2 by a first distance d1 in the x direction. A distance between the pair of the first dummy channel structures DCH1 in the y direction may be smaller than the first distance d1.

In this disclosure, dummy channel structures DCH may be referred to as a vertical structure. For example, the vertical structure may include a first vertical structure disposed closest to the first region R1 in the second region R2 and connected to the first upper pad region UP1. The first vertical structure may refer to the first dummy channel structure DCH1.

Two sets of dummy channel structures DCH forming a pair of the first dummy channel structures DCH1 and a pair of the second dummy channel structures DCH2 may be arranged to be parallel to each other in the x direction in the second upper pad region UP2 provided by the gate electrode 130Sd disposed below the uppermost gate electrode 130Su.

The first and second separation regions MS1, MS2a, and MS2b may be arranged to extend in the x direction in the first region R1 and the second region R2. The first and second separation regions MS1, MS2a, and MS2b may be arranged to be parallel to each other. The first separation regions MS1 and the second separation regions MS2a and MS2b may be arranged to form a constant pattern in the y direction, and the second separation regions MS2a and MS2b are aligned with and spaced apart from each other in the x direction. The first and second separation regions MS1, MS2a, and MS2b may be through separation regions connected to the substrate 101 through the entire gate electrodes 130 stacked on the substrate 101. The first and second separation regions MS1, MS2a, and MS2b may be arranged by partially recessing an upper portion of the substrate 101 or may be arranged to be in contact the upper surface of the substrate 101 on the substrate 101. The second separation regions MS2a and MS2b may reduce stress applied to the gate electrodes 130 as the number of stacks of the gate electrodes 130 increases.

The second separation regions MS2a and MS2b may include the second main separation regions MS2a spaced apart from each other at a predetermined or alternatively, desired interval in the y direction between the pair of first separation regions MS1 and second auxiliary separation regions MS2b spaced apart from each other at a predetermined or alternatively, desired interval in the y direction between the first separation region MS1 and the second main separation region MS2a.

The second main separation regions MS2a may be arranged throughout the first region R1 and the second region R2. The second main separation regions MS2a may be arranged to extend from the first region R1 to a part of the second region R2 as one body and spaced apart therefrom in the x direction and extend as one body again in the second region R2. A plurality of second main separation regions MS2a may be separated and arranged at a predetermined or alternatively, desired interval on a straight line. The second auxiliary separation regions MS2b may be disposed only in the second region R2. A plurality of second auxiliary separation regions MS2b may be separated and arranged at a predetermined or alternatively, desired interval on a straight line.

The second auxiliary separation regions MS2b may have sides extending in the x direction on a plan view. The sides extending in the x direction of the second auxiliary separation regions MS2b may extend substantially evenly in the x direction without protrusions. A portion in which the side of the second auxiliary separation regions MS2b extends as a straight line may have a length equal to or greater than a first distance d1. The dummy channel structures DCH may not be arranged in a region in which the second auxiliary separation regions MS2b are arranged. The second auxiliary separation regions MS2b may not overlap the dummy channel structures DCH. A width of the second auxiliary separation regions MS2b in the y direction may be greater than a maximum width of the dummy channel structures DCH. The second auxiliary separation regions MS2b may in a contact with a portion of the upper separation region SS.

As illustrated in FIGS. 3A to 4E, the first and second separation regions MS1, MS2a, and MS2b may include a conductive layer 109 and/or an separation insulating layer 107 covering sides of the conductive layer 109. The conductive layer 109 may be formed of a conductive material, and the separation insulating layer 107 may be formed of an insulating material. The conductive layer 109 may be separated from the gate electrodes 130 by the separation insulating layer 107. The first separation regions MS1 may include the common source line CSL described above with reference to FIG. 2, and the second separation regions MS2a and MS2b may include a dummy common source line. In some example embodiments, the dummy common source line may be in a floating state in which the dummy common source line is not connected to devices driving the semiconductor device 100 or an electrical signal is not applied thereto. A structure of a cross section of the first separation regions MS1 in the y direction may be the same or substantially the same as a structure of a cross section of the second separation regions MS2a and MS2b in the y direction. However, according to some example embodiments, a width of the first separation regions MS1 in the y direction may be greater than a width of the second separation regions MS2 in the y direction.

The second auxiliary separation region MS2b may have a first edge portion eg1 adjacent to the first dummy channel structure DCH1. The first edge portion eg1 of the second auxiliary separation regions MS2b may be spaced apart from a central axis of the first dummy channel structure DCH1 by a second distance d2 in the x direction. A first extension line passing through the first edge portion eg1 of the second auxiliary separation regions MS2b and the central axis of the first dummy channel structure DCH1 may form a first angle $\theta 1$ (0°<$\theta 1$<90° with a second extension line in the x direction. The first edge portion eg1 of the second auxiliary separation regions MS2b may be spaced apart from the central axis of the first dummy channel structure DCH1 by a third distance d3 which is a straight line distance.

In some example embodiments, the second distance d2 may be smaller than the first distance d1. The second distance d2 may be greater than one-third of the first distance d1. The second distance d2 may be greater than a maximum diameter of the dummy channel structures DCH. The second distance d2 may be smaller than the first length L1 of the first upper pad region UP1 and the second length L2 of the second upper pad region UP2. The second distance d2 may be greater than one-twentieth of the second length L2 of the second upper pad region UP2.

In some example embodiments, the first distance d1 may range from about 400 nm to about 600 nm. The second distance d2 may range from about 150 nm to about 400 nm. The third distance d3 may range from about 200 nm to about 500 nm.

In some example embodiments, the first angle $\theta 1$ may be smaller than about 40°. The first angle $\theta 1$ may decrease as the second distance d2 or the third distance d3 increases.

The second auxiliary separation region MS2b may have a first end point e1 which is a starting point extending in the x direction from the second region R2. The first end point e1 may be one end point where the second auxiliary separation region MS2b is closest to the first region R1. The first end point e1 may be located on the first edge portion eg1 and may be an end point where the second auxiliary separation region MS2b is in contact with the upper separation region SS, but is not limited thereto. The first end point e1 of the second auxiliary separation region MS2b may be spaced apart from the channel structure CH closest to the second auxiliary separation region MS2b by a fourth distance d4 in the x direction. The first end point e1 of the second auxiliary separation regions MS2b may be spaced apart from the first end S1 of the uppermost gate electrode 130Su by a fifth distance d5 in the x direction.

In some example embodiments, the fourth distance d4 may be greater than a distance over which the first dummy channel structure DCH1 is spaced apart from the channel structure CH closest to the first dummy channel structure DCH1 in the x direction. The fifth distance d5 may be smaller than a distance over which the first dummy channel structure DCH1 is spaced apart from the first end S1 in the x direction.

In some example embodiments, the fourth distance d4 may range from about 300 nm to about 500 nm. The fifth distance d5 may range from about 200 nm to about 400 nm.

According to some example embodiments in the present disclosure, the first auxiliary separation region MS2b may be disposed to be spaced apart from the first dummy channel structure DCH1 by a predetermined or alternatively, desired distance, whereby a pattern defect that the second auxiliary separation region MS2b is bent toward the first dummy channel structure DCH1 or the edge portion eg1 of the second auxiliary separation region MS2b protrudes toward the first dummy channel structure DCH1 may be reduced or minimized. If the pattern defect occurs, in the process of removing a conductive material from an opening OP after forming the gate electrode with the conductive material through the opening OP (see FIGS. 8C and 8D), the conductive material may remain between the second auxiliary separation region MS2b and the lower gate electrode layer 130 due to the pattern defect. In some example embodiments, since deposition of a residue of the conductive material is reduced or prevented by reducing or minimizing the pattern defect, a semiconductor device with improved electrical properties may be provided. In addition, when the edge portion of the opposite side of the second auxiliary separation region MS2b or the second main separation region MS2a is disposed to be spaced apart from the dummy channel structures DCH adjacent thereto by a predetermined or alternatively, desired distance, the same effect of reducing or preventing the pattern defect may be obtained.

However, when the second auxiliary separation regions MS2b are formed to deviate from the descriptions of the first to fifth distances d1, d2, d3, d4, and d5 and the first angle θ1 described above, a defect may occur in the pattern of the second auxiliary separation regions MS2b. For example, if the second distance d2 is smaller than about 150 nm, the edge portion of the second auxiliary separation regions MS2b may not be sufficiently spaced apart from the first dummy channel structure DCH1, and in some example embodiments, the second auxiliary separation regions MS2b may be bent or protrude toward the first dummy channel structure DCH1. In addition, if the second distance d2 is greater than about 400 nm, the edge portion of the second auxiliary separation regions MS2b is disposed close to the second dummy channel structure DCH2, and in some example embodiments, the second auxiliary separation regions MS2b may be bent or protrude toward the second dummy channel structure DCH2.

Referring to FIGS. 4A and 4B, FIG. 4A is a cross-sectional view of the first dummy channel structure DCH1 taken along line I-I' in the y direction, and FIG. 4B is a cross-sectional view taken along line II-II' passing through the second dummy channel structure DCH2 in the y direction.

Since the first edge portion eg1 and the first end point e1 of the second auxiliary separation region MS2b are spaced apart from the central axis of the first dummy channel structure DCH1, a cross section of the second auxiliary separation region MS2b may not be visible between the dummy channel structures DCH and a cross section of the upper separation region SS may be shown in the cross-sectional view of FIG. 4A. As shown in FIG. 4B, the second auxiliary separation region MS2b may overlap the second dummy channel structure DCH2 in the y direction, and thus a cross section of the second auxiliary separation region may be shown between the dummy channel structures DCH.

The upper separation regions SS may extend in the x direction between the first separation regions MS1 and the second main separation regions MS2a in the first region R1. The upper separation regions SS may be arranged to be parallel to the second auxiliary separation region MS2b and may in contact with the end point of the second auxiliary separation region MS2b. The upper separation regions SS may be disposed to penetrate a part of the gate electrodes 130 including the string select gate electrodes 130Su and 130Sd among the gate electrodes 130. The string select gate electrodes 130S separated by the upper separation regions SS may form different string select lines SSL1_1, SSL1_2, SSL1_3, SSL2_1, SSL2_2, and SSL2_3 (see FIG. 2).

The upper separation regions SS may include the upper insulating layer 103. As illustrated in FIGS. 4A, 4C, and 4D, the upper insulating layer 103 may include string select gate electrodes 130Su and/or 130Sd to separate the three gate electrodes 130 from each other in the y direction. However, the number of gate electrodes 130 separated by the upper insulating layer 103 may be variously modified in example embodiments.

The lower separation region GS may be disposed at the same level as the lowermost ground select gate electrode 130G. The lower separation region GS may be disposed adjacent to a region in which the second main separation regions MS2a are spaced apart from each other. The ground select gate electrode 130G may be separated or divided into four layers in the y direction between the pair of first separation regions MS1 by the lower separation region GS. For example, the lower separation regions GS may be arranged to connect the second main separation regions MS2a, including a region in which the second main separation regions MS2a are spaced apart from each other.

As shown in FIG. 4E, the lower separation region GS may include the lower insulating layer 160. The lower insulating layer 160 may be formed of, for example, silicon oxide, and may be the same material as the interlayer insulating layer 120.

Referring to FIG. 4F, the pad region PAD will be described in detail. In FIG. 4F, for the purposes of description, the diffusion barrier 133 forming a part of the gate electrodes 130 is omitted and only the gate electrodes 130 are displayed.

The pad region PAD may include the upper pad regions UP1, UP2, UP3, UP4, UP5, and/or UP6 having a step structure sequentially lowered in the x direction from the first region R1 toward the second region R2, dummy pad regions DP1, DP2, DP3, and/or DP4 having a step structure lowered in each of the x direction and the y direction, and one or a plurality of middle pad regions MP, and/or lower pad regions LP1, LP2, LP3, LP4, and/or LP5. Contact plugs MC penetrating through the cell region insulating layer 170 may be disposed on the pad region PAD.

The gate electrodes 130 may include a lower gate group 130_1, an intermediate gate group 130_2, and/or an upper gate group 130_3. The intermediate gate group 130_2 may be disposed on the lower gate group 130_1. The upper gate group 130_3 may be disposed on the intermediate gate group 130_2.

The lower gate group 130_1 may include a first lower gate electrode 130_1a, a second lower gate electrode 130_1b, a third lower gate electrode 130_1c, a fourth lower gate electrode 130_1d, and/or a fifth lower gate electrode 130_1e sequentially stacked from the substrate 101. The lower gate groups 130_1 may extend by different lengths in the x direction in the second region R2 to provide lower pad regions LP1, LP2, LP3, LP4, and/or LP5. For example, the fifth lower gate electrode 130_1e may provide a first lower pad region LP1. The lower gate group 130_1 may have a step structure in the x direction as shown in FIG. 4F, and referring to FIG. 4A, the lower gate group 130_1 may have a step structure in the y direction. The first lower gate electrode 130_1a may be a ground select gate electrode 130G.

The intermediate gate group 130_2 may be one or a plurality of gate groups. Each of the one or a plurality of intermediate gate groups 130_2 may include a first intermediate gate electrode 130_2a, a second intermediate gate electrode 130_2b, a third intermediate gate electrode 130_2c, a fourth intermediate gate electrode 130_2d, and/or a fifth intermediate gate electrode 130_2e sequentially stacked on the lower gate group 130_1. The intermediate gate groups 130_2 may be extended in different lengths in the x direction in the second region R2 to provide intermediate pad regions MP. As shown in FIG. 4F, the intermediate gate group 130_2 may have a step structure between the intermediate gate groups 130_2 in the x direction, and as shown in FIG. 4A, each of the intermediate gate electrodes 130_2a, 130_2b, 130_2c, 130_2d, and/or 130_2e forming one intermediate gate group 130_2 may also have a step structure in the y direction. Accordingly, a portion of an upper surface of each of the intermediate gate electrodes 130_2a, 130_2b, 130_2c, 130_2d, and/or 130_2e forming one intermediate gate group 130_2 may be exposed upward to provide the intermediate pad regions MP. The intermediate gate electrodes 130_2a, 130_2b, 130_2c, 130_2d, and/or 130_2e may be memory cell gate electrodes 130M.

The upper gate group 130_3 may include a first upper gate electrode 130_3a, a second upper gate electrodes 130_2b, a third upper gate electrode 130_3c, a fourth upper gate electrode 130_3d, a fifth upper gate electrode 130_3e, and/or a sixth upper gate electrode 130_3f sequentially stacked on the uppermost intermediate gate group 130_2. The upper gate groups 130_3 may extend by different lengths in the x direction in the second region R2 to provide upper pad regions UP1, UP2, UP3, UP4, UP5, and/or UP6. For example, the sixth upper gate electrode 130_3f may provide the first upper pad region UP1. As illustrated in FIG. 4F, the upper gate group 130_3 may have a step structure in the x direction, but referring to FIG. 4A, the upper gate group 130_3 may not have a step structure in the y direction. The sixth upper gate electrode 130_3f may be a string select gate electrode 130Su.

Dummy pad regions DP1, DP2, DP3, and/or DP4 may be disposed on the first upper gate electrode 130_3a. The dummy pad regions DP1, DP2, DP3, and/or DP4 may have a step structure lowered in each of the x direction and the y direction. For example, the dummy pad regions DP1, DP2, DP3, and/or DP4 may have a step structure of at least five steps in each of the x direction and the y direction.

The contact plugs MC may penetrate a part of the cell region insulating layer 170 from an upper portion in the second region R2 and may be connected to each of the uppermost gate electrodes 130 among the gate electrodes 130 forming the pad region PAD. The contact plugs MC partially recess the gate electrodes 130 and may be connected to the gate electrodes 130. The contact plugs MC may be connected to wiring lines at the upper portion. The contact plugs MC may electrically connect the gate electrodes 130 to circuit elements in a peripheral circuit region. The position, number, and/or shape of the contact plugs MC may be variously changed. For example, the contact electrodes MC may be connected to the gate electrodes 130, respectively. The contact plugs MC may include a conductive material, for example, tungsten (W), copper (Cu), aluminum (Al), or the like. The contact plugs MC may further include a barrier metal layer.

Referring to FIGS. 3B and 4F, the contact plugs MC may include a first upper contact plug MCu1 disposed between the pair of first dummy channel structures DCH1 and the pair of second dummy channel structures DCH2 in the first upper pad region UP1. The first contact plug MCu1 may be disposed at a central region of the first upper pad region UP1.

The contact plugs MC may include, in addition to the first upper contact plug MCu1, a second upper contact plug MCu2 connected to the second upper pad region UP2, a third upper contact plug MCu3 connected to the third upper pad region UP3, a fourth upper contact plug MCu4 connected to the fourth upper pad region UP4, a fifth upper contact plug MCu5 connected to fifth upper pad region UP5, and/or a sixth upper contact plug MCu6 connected to the sixth upper pad region UP6. The contact plugs MC may include first to fourth dummy contact plugs MCd1, MCd2, MCd3, and/or MCd4 connected to the first to fourth dummy pad regions DP1, DP2, DP3, and/or DP4, respectively. The contact plugs MC may include one or a plurality of intermediate contact plugs MCm connected to one or a plurality of intermediate pad regions MP, respectively. The contact plugs MC may include first to fourth lower contact plugs MC11, MC12, MC13, MC14, and/or MC15 connected to the lower pad regions LP1, LP2, LP3, LP4, and/or LP5, respectively.

The cell region insulating layer 170 may be disposed to cover the substrate 101 and/or the stacked structure of the gate electrodes 130. In some example embodiments, the cell region insulating layer 170 may include a plurality of insulating layers. The cell region insulating layer 170 may include an insulating material such as silicon oxide and silicon nitride.

FIG. 5 is a schematic cross-sectional view of a semiconductor device according to example embodiments in the present disclosure. FIG. 5 is a cross-sectional view taken along line VII-VII' in FIG. 4B. Line VII-VII' is a cut line that horizontally cuts the semiconductor device at a level between the upper end of the substrate insulating layer and the lower end of the first separation regions (see FIGS. 4A to 4E).

Referring to FIG. 5, unlike the case of FIG. 3B, the upper separation region SS, the gate electrode 130, and the contact plugs MC are not illustrated. In addition, since it is a cross-sectional view of the level between the upper end of the substrate insulating layer 110 and the lower end of the first separation regions MS1, the substrate insulating layer 110 disposed in the substrate 101 of the second region R2 is illustrated.

Referring to FIG. 4D together, since the widths of the first separation regions MS1 and the second separation regions MS2a and MS2b in the x and y directions decrease toward the substrate 101, respectively, the first separation regions MS1 and the second separation regions MS2a and MS2b may have a relatively small size, compared with the plan view of FIG. 3B.

The second auxiliary separation region MS2b may have a first lower edge portion leg1 having a greater distance from the central axis of the first dummy channel structure DCH1 than the first edge portion eg1. The first lower edge portion leg1 of the second auxiliary separation region MS2b may be disposed to be spaced apart by a second distance ld2 in the x direction from the central axis of the first dummy channel structure DCH1. The second distance ld2 may be relatively larger than the second distance d2 in FIG. 3B. The first extension line passing through the first lower edge portion leg1 of the second auxiliary separation region MS2b and the central axis of the first dummy channel structure CH may form a second angle θ2 (0°<θ1<90° with a second extension line in the x direction. The second angle θ2 may be smaller than the first angle θ1 of FIG. 3B. The first lower edge portion leg1 of the second auxiliary separation regions MS2b may be spaced apart by a third distance ld3 which is a straight line distance from the central axis of the first dummy channel structure DCH1. The third distance ld3 may be greater than the third distance d3 of FIG. 3B.

The second auxiliary separation region MS2b may have a first lower end point le1 having a greater distance from the first region R1 than the first end point e1. The first lower end point le1 of the second auxiliary separation region MS2b may be spaced apart from the channel structure CH closest to the second auxiliary separation region MS2b by a fourth distance ld4 in the x direction. The fourth distance ld4 may be greater than the fourth distance d4 of FIG. 3B.

A case where a defective pattern in which the second auxiliary separation region MS2b is bent or protrudes toward the first dummy channel structure DCH1 occurs may be a case where an opening OP for forming the second auxiliary separation region MS2b (See FIG. 8C) is bent or protrudes toward the dummy channel structure (DCH). In some example embodiments, the opening OP may partially recess the substrate insulating layer 110. In the process of forming the gate electrode with a conductive material after the opening OP is formed, a residue of the conductive material may be deposited between the second auxiliary separation region MS2b, the lower gate electrode 130, and/or the substrate insulating layer 110 due to the defective pattern to cause defects. According to some example embodiments in the present disclosure, since the second auxiliary separation region MS2b is disposed to be spaced apart from the first dummy channel structure DCH1 by a predetermined or alternatively, desired distance, the occurrence of the defective pattern may be reduced.

Figure 6A:
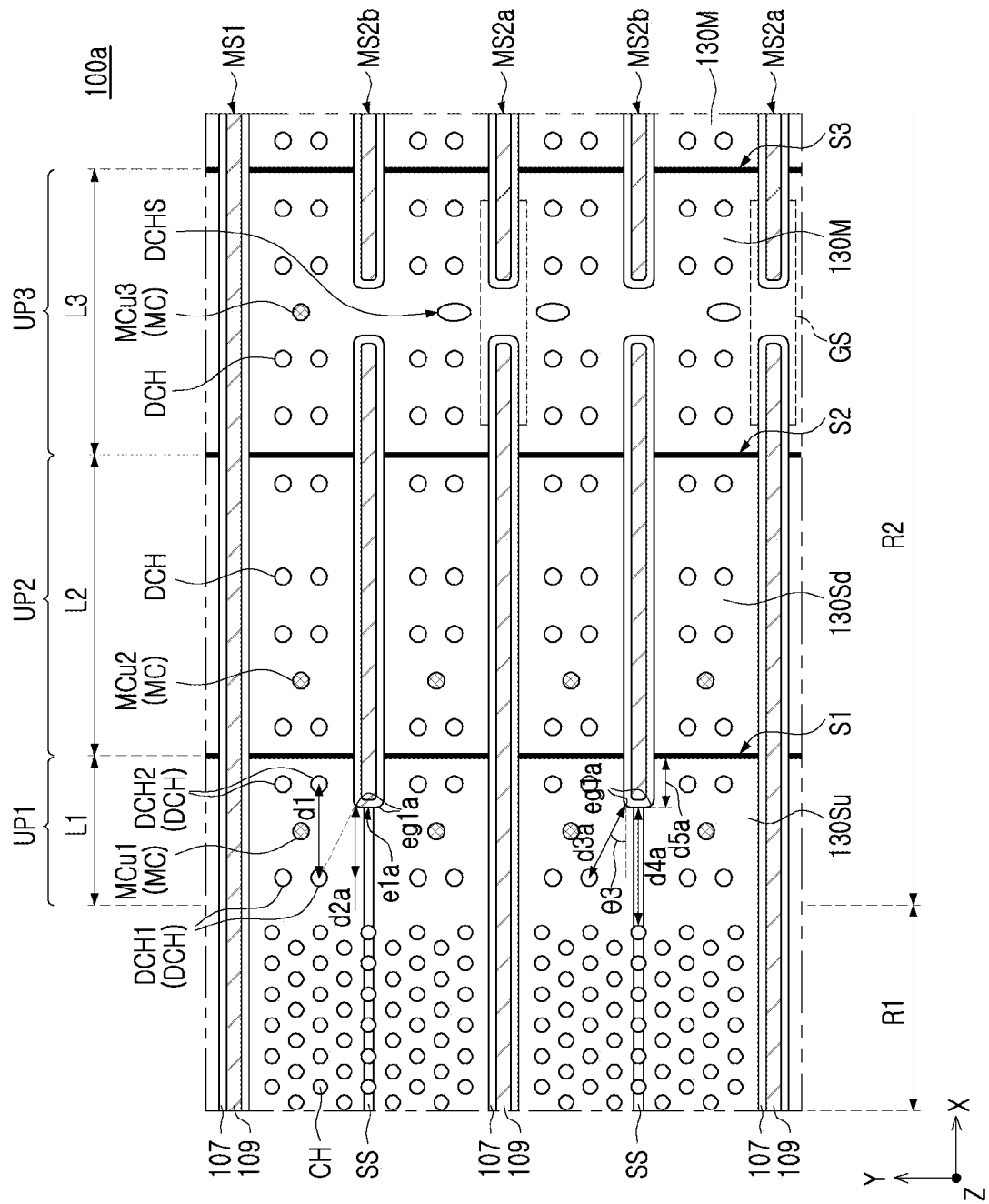
FIGS. 6A to 6C are partially enlarged plan views illustrating a modification of a semiconductor device according to example embodiments in the present disclosure.
Figure 6B:
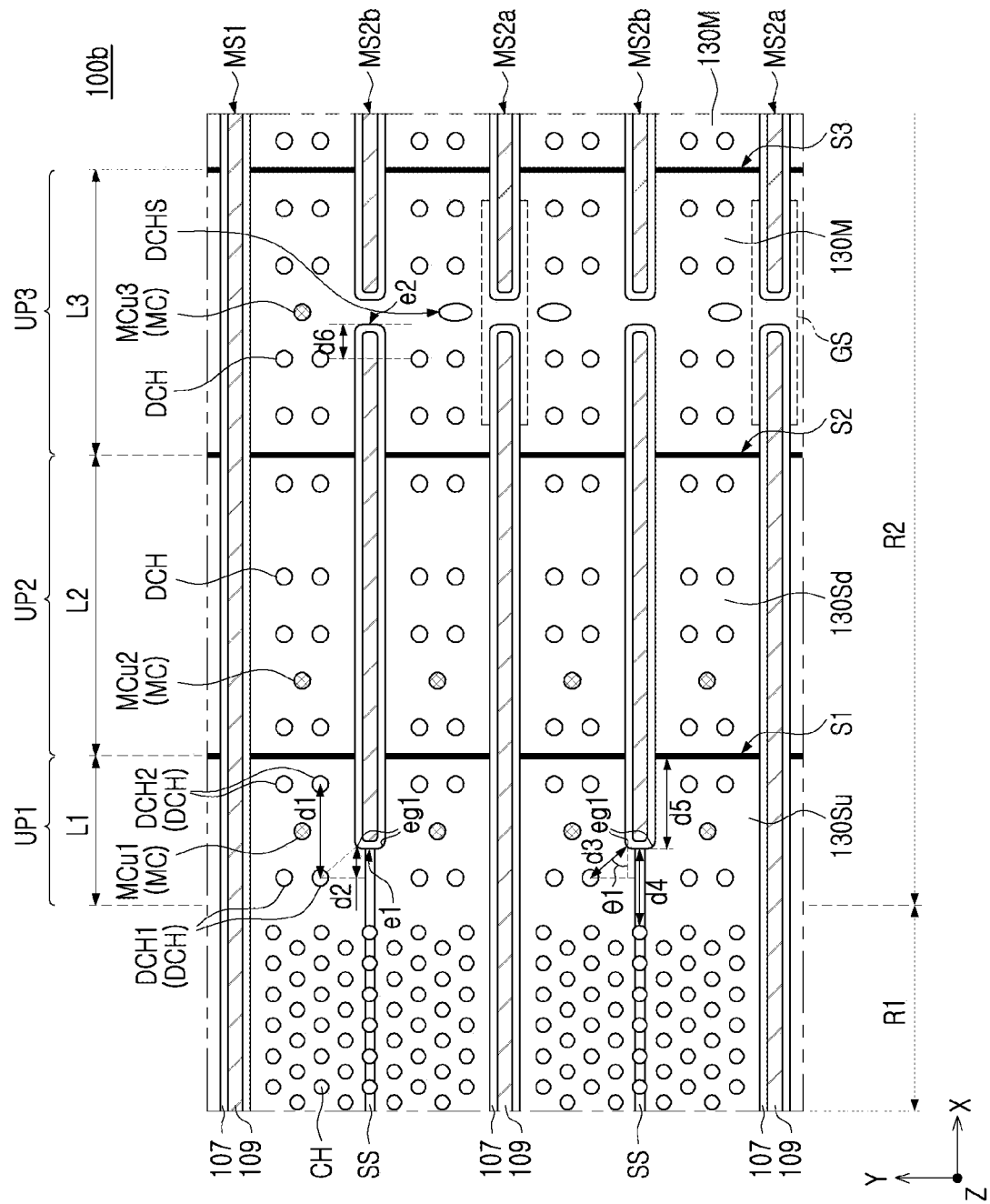
Figure 6C:
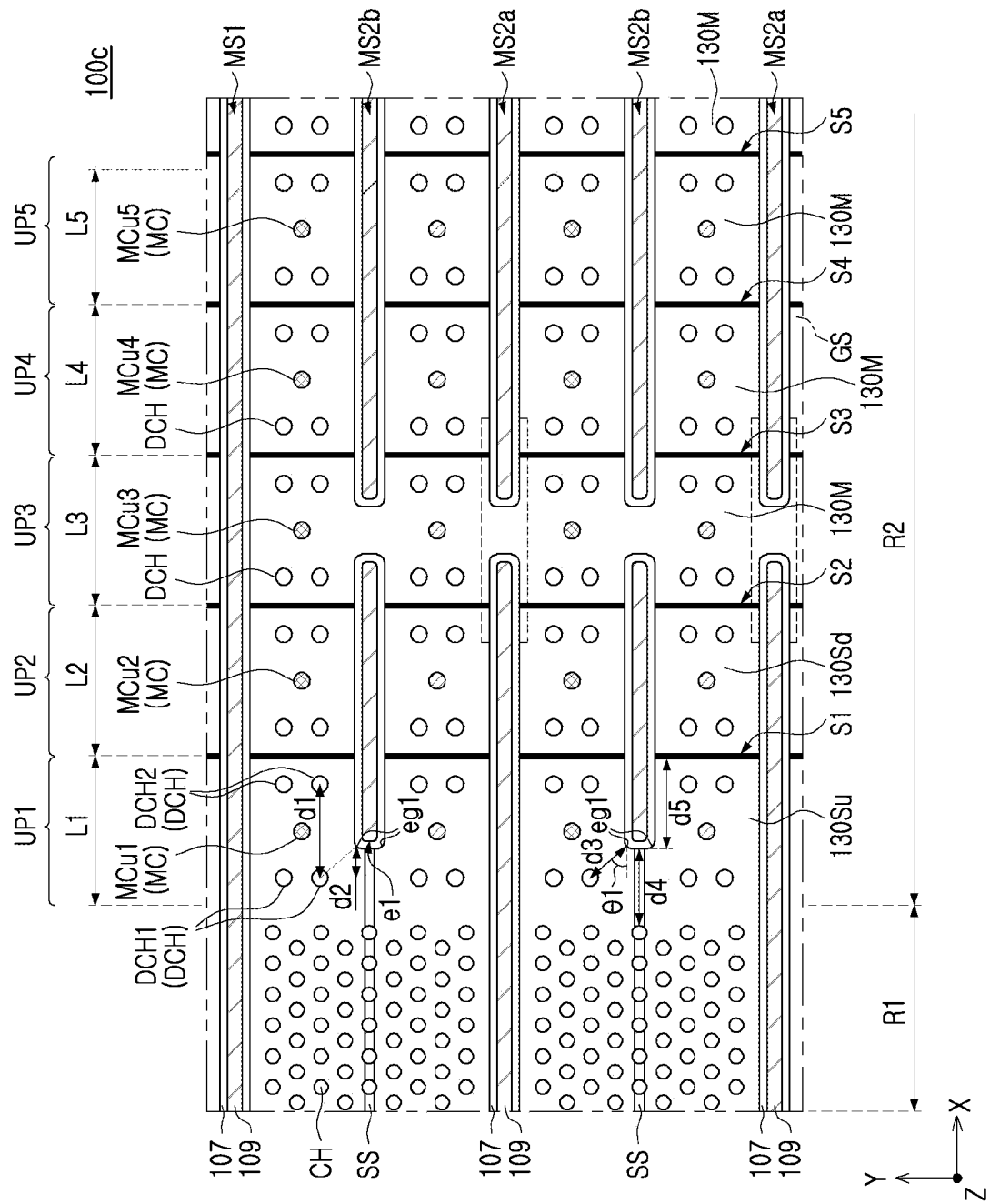

FIGS. 6A to 6C are partially enlarged plan views illustrating a modification of a semiconductor device according to some example embodiments in the present disclosure.

Referring to FIG. 6A, in a semiconductor device 100a, the first end point e1a and the first edge portion eg1a of the second auxiliary separation regions MS2b may be closer to the first end S1 than the first upper contact structure MCu1.

A distance between the first edge portion eg1a and the central axis of the first dummy channel structure DCH1 in the x direction may increase relative to example embodiments of FIG. 3B. For example, the first edge portion eg1 may be spaced apart from the central axis of the first dummy channel structure DCH1 by a second distance d2a in the x direction. The first edge portion eg1a may form a first angle θ1d with an extension line from the central axis of the first dummy channel structure DCH1 in the x direction and may be spaced apart therefrom by a third distance d3a.

The first end point e1 may be spaced apart from the channel structures CH closest to the second auxiliary separation regions MS2b by a fourth distance d4a in the x direction. The first end point e1 may be spaced apart by a fifth distance d5a in the x direction from the first end S1 of the uppermost gate electrode 130Su.

The second to fifth distances d2a, d3a, d4a, and/or d5a may relatively increase compared to example embodiments of FIG. 3B. The first angle θ1d may relatively decrease compared to example embodiments of FIG. 3B. However, changeable ranges of the second to fifth distances d2a, d3a, d4a, and/or d5a and the first angle θ1d may not deviate from the description of the distances and angles described above with reference to FIG. 3B.

Referring to FIG. 6B, in a semiconductor device 100b, the second auxiliary separation regions MS2b may have a first end point e1 and a second end point e2 located on the opposite side in the x direction. The second end point e2 may be disposed to be spaced apart from the central axis of the dummy channel structure DCH disposed in the third upper pad region UP3 in the x direction, away from the first region R1. The second end point e2 may be spaced apart from the central axis of the dummy channel structure DCH disposed in the third upper pad region UP3 by a sixth distance d6 in the x direction. The dummy channel structure DCH may be a dummy channel structure DCH disposed adjacent to the third upper contact structure MCu3.

The present example embodiments may be understood as example embodiments of the semiconductor device 100b including the second auxiliary separation regions MS2b in which distances separated from each other in the x direction are reduced. In addition, although not shown, the end points or edge portions of the second main separation regions MS2a, as well as the second auxiliary separation regions MS2b, may be arranged to be spaced apart from the central axis of the adjacent dummy channel structure DCH by a predetermined or alternatively, desired distance in the x direction.

In the present example embodiments, in addition to the starting point where the second auxiliary separation regions MS2b extend to the second region R2, the edge portion or the end point where the second auxiliary separation regions MS2b are spaced apart from each other in the x direction is disposed to be spaced apart from the dummy channel structure DCH by a predetermined or alternatively, desired distance, thus reducing or minimizing a pattern defect that the second auxiliary separation regions MS2b are bent or protrude toward the dummy channel structures DCH.

Referring to FIG. 6C, in a semiconductor device 100c, pad regions PAD may include a first upper pad region UP1, a second upper pad region UP2, a third upper pad region UP3, a fourth upper pad region UP4, and/or a fifth upper pad region UP5 extending by the same length in the x direction.

In some example embodiments, dummy channel structures DCH adjacent to four corners may be respectively disposed in one unit pad region. Each unit pad region may be connected to the contact plugs MC, and the contact plugs MC may include first to fifth contact plugs MCu1, MCu2, MCu3, MCu4, and/or MCu5 connected to first to fifth upper pad regions UP1, UP2, UP3, UP4, and/or UP5, respectively.

In some example embodiments, the first edge portion eg1 and the first end point e1 of the second auxiliary separation region MS2b need only be spaced apart from the first dummy channel structure DCH1 by a predetermined or alternatively, desired distance, and positions of the dummy channel structures DCH, the contact plugs MC, the lower separation region GS, and the gate ends S1, S2, S3, S4, and/or S5, or the length of one unit pad region may be understood as an example of a variously modifiable semiconductor device 100c.

FIGS. 7A to 7D are cross-sectional views illustrating another modification of a semiconductor device according to some example embodiments in the present disclosure.

Figure 7A:
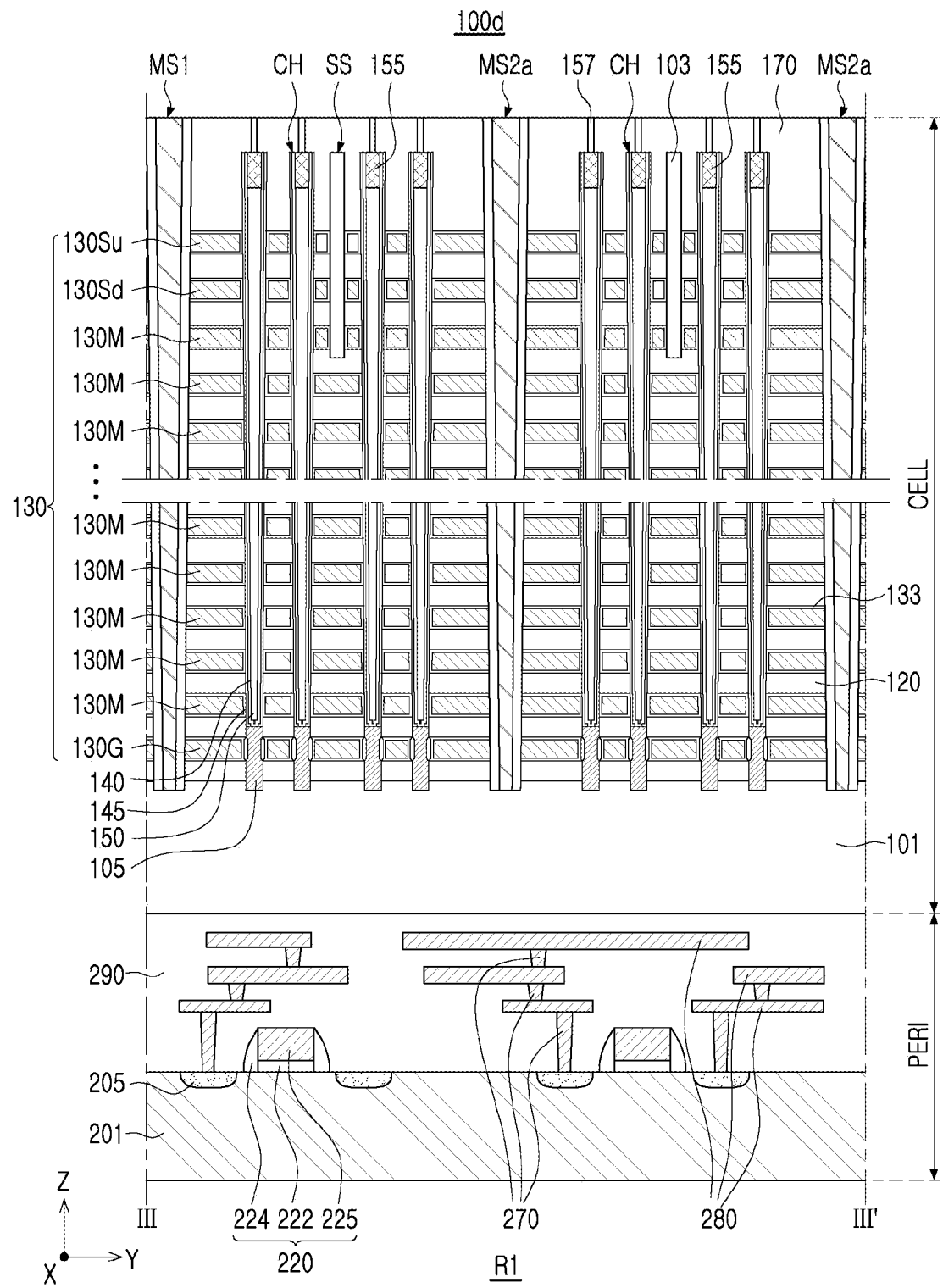
FIGS. 7A to 7D are cross-sectional views illustrating another modification of a semiconductor device according to example embodiments in the present disclosure.

Referring to FIG. 7A, a semiconductor device 100d may include a memory cell region CELL and/or a peripheral circuit region PERI. The memory cell region CELL may be disposed at an upper of the peripheral circuit region PERI. In some example embodiments, the cell region CELL may be disposed at a lower end of the peripheral circuit region PERI.

As described above with reference to FIGS. 3A to 4C, the memory cell region CELL may include a substrate 101, a substrate insulating layer 110, gate electrodes 130, channel structures CH and/or dummy channel structures DCH, first and second separation regions MS1, MS2a, and MS2b, and/or an upper separation region SS. The memory cell region CELL may have a structure according to various example embodiments as described above with reference to FIGS. 3B to 6C.

The peripheral circuit region PERI may include a base substrate 201, circuit elements 220 arranged on the base substrate 201, circuit contact plugs 270, and/or wiring lines 280.

The base substrate 201 may have an upper surface extending in the x direction and the y direction. The base substrate 201 may be formed with separate device isolation layers to define an active region. Source/drain regions 205 including impurities may be arranged in a portion of the active region. The base substrate 201 may include a semiconductor material, such as a group IV semiconductor, a group III-V compound semiconductor, or a group II-VI oxide semiconductor.

The circuit elements 220 may include a planar transistor. Each circuit element 220 may include a circuit gate insulating layer 222, a spacer layer 224, and/or a circuit gate electrode 225. Source/drain regions 205 may be arranged in the base substrate 201 on both sides of the circuit gate electrode 225.

A peripheral region insulating layer 290 may be disposed on the circuit element 220 of the base substrate 201. The circuit contact plugs 270 may be connected to the source/drain regions 205 through the peripheral region insulating layer 290. An electrical signal may be applied to the circuit element 220 by the circuit contact plugs 270. In a region not shown, circuit contact plugs 270 may also be connected to the circuit gate electrode 225. The wiring lines 280 may be connected to the circuit contact plugs 270 and may be arranged as a plurality of layers. The gate electrodes 130 of the memory cell region CELL may be connected to circuit elements 220 of the peripheral circuit region PERI through a separate through region penetrating the peripheral circuit region PERI and through vias in the through region in a region not shown.

In the semiconductor device 100d, after the peripheral circuit region PERI is first manufactured, the substrate 101 of the memory cell region CELL may be formed thereon to manufacture the memory cell region CELL. The substrate 101 may have the same size as the base substrate 201 or may be formed smaller than the base substrate 201.

Figure 7B:
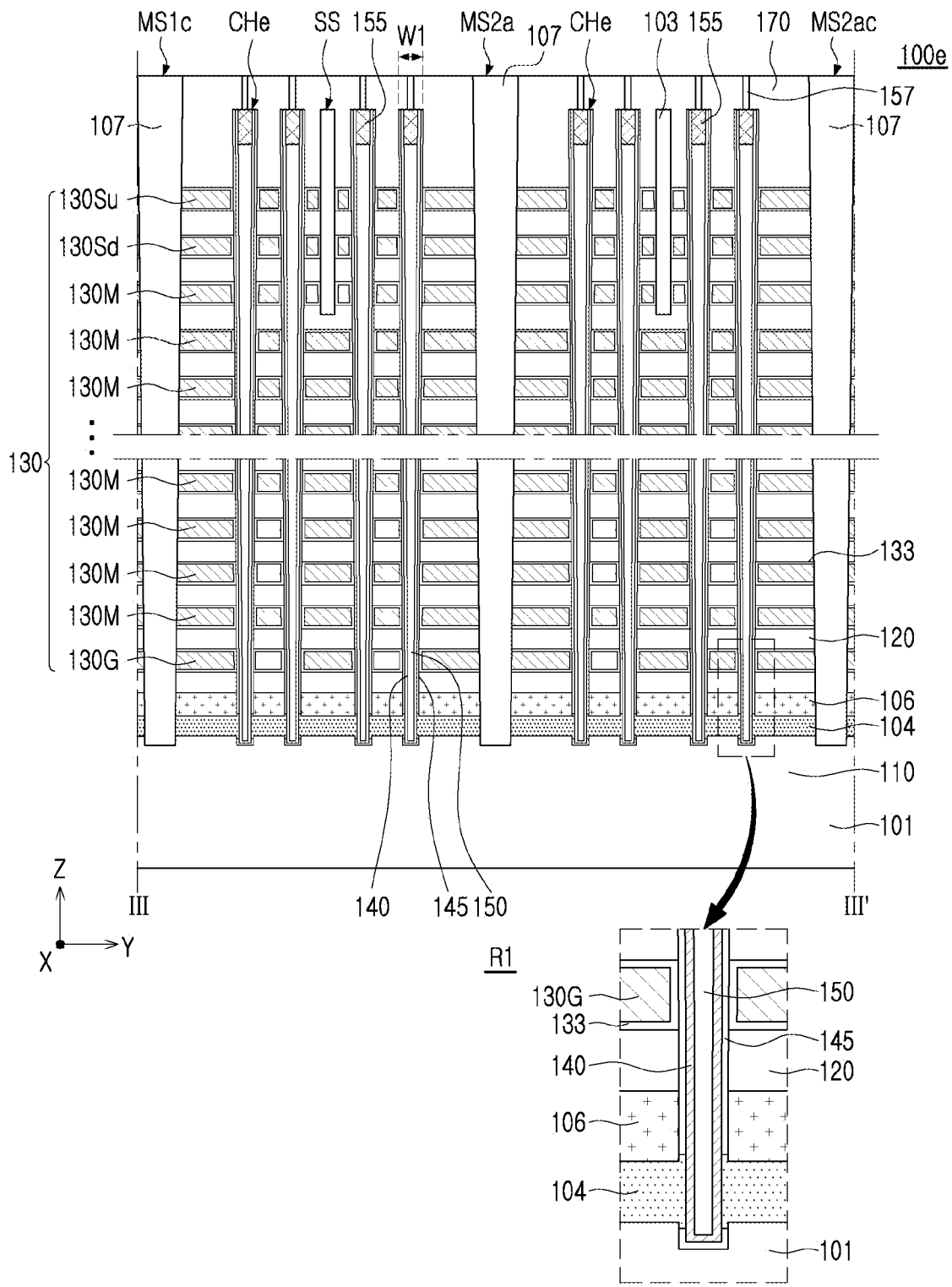

Referring to FIG. 7B, a semiconductor device 100e may further include first and/or second horizontal conductive layers 104 and 106 disposed between the substrate 101 and the lowermost interlayer insulating layer 120 on an upper surface of the substrate 101. In addition, in the semiconductor device 100e, a structure of the channel structures CHe may be different from example embodiments of FIGS. 3A to 4G, the first and second separation regions MS1c, MS2ac, and MS2bc may be formed of an separation insulating layer 107, and a substrate insulating layer 110 may not be provided.

At least some of the first and second horizontal conductive layers 104 and/or 106 may function as a part of a common source line of the semiconductor device 100e and may also function as a common source line together with the substrate 101. As shown in an enlarged view of FIG. 7B, the first horizontal conductive layer 104 may be directly connected to the channel layer 140 at a circumference of the channel layer 140. The first and/or second horizontal conductive layers 104 and 106 may include a semiconductor material, for example, polycrystalline silicon. In some example embodiments, at least the first horizontal conductive layer 104 may be a doped layer, and the second horizontal conductive layer 106 may be a doped layer or a layer containing impurities diffused from the first horizontal conductive layer 104. The first horizontal conductive layer 104 may be referred to as a source conductive layer.

The channel structures CHe may not include the epitaxial layer 105 (see FIG. 4C) and have a structure in which the channel layer 140 extends to a lower end and is connected to the first horizontal conductive layer 104.

Figure 7C:
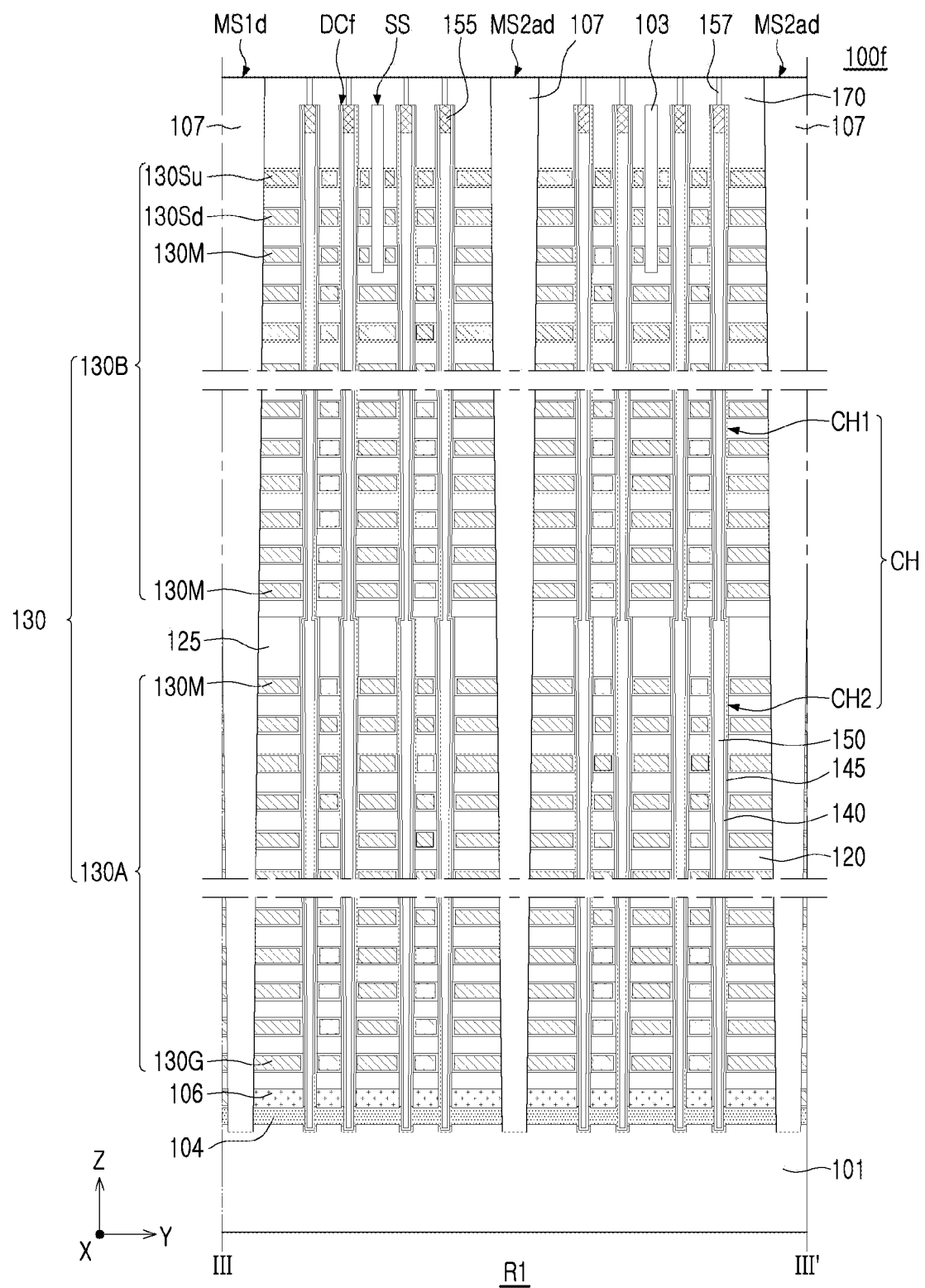

Referring to FIG. 7C, in a semiconductor device 100f, a stacked structures of the gate electrodes 130 are formed of vertically stacked lower and upper stacked structures 130A and 130B, and channel structures CHf may include first and second channel structures CH1 and CH2 being vertically stacked. The structure of the channel structures CHf may be introduced to stably form the channel structures CHf when the number of the relatively stacked gate electrodes 130 is large. In addition, in the semiconductor device 100f, the first and second separation regions MS1d, MS2ad, and MS2bd may be formed of an separation insulating layer 107.

The channel structures CHf may have a form in which the lower first channel structures CH1 and the upper second channel structures CH2 are connected, and may have a bent portion due to a difference in width in a connecting region. The channel layer 140, the gate dielectric layer 145, and the channel insulating layer 150 may be connected to each other between the first channel structure CH1 and the second channel structure CH2. A channel pad 1550 may be disposed only at the upper end of the upper second channel structure CH2. However, in some example embodiments, the first channel structure CH1 and the second channel structure CH2 are each include channel pads 155. In some example embodiments, the channel pad 155 of the first channel structure CH1 may be connected to the channel layer 140 of the second channel structure CH2.

Figure 7D:
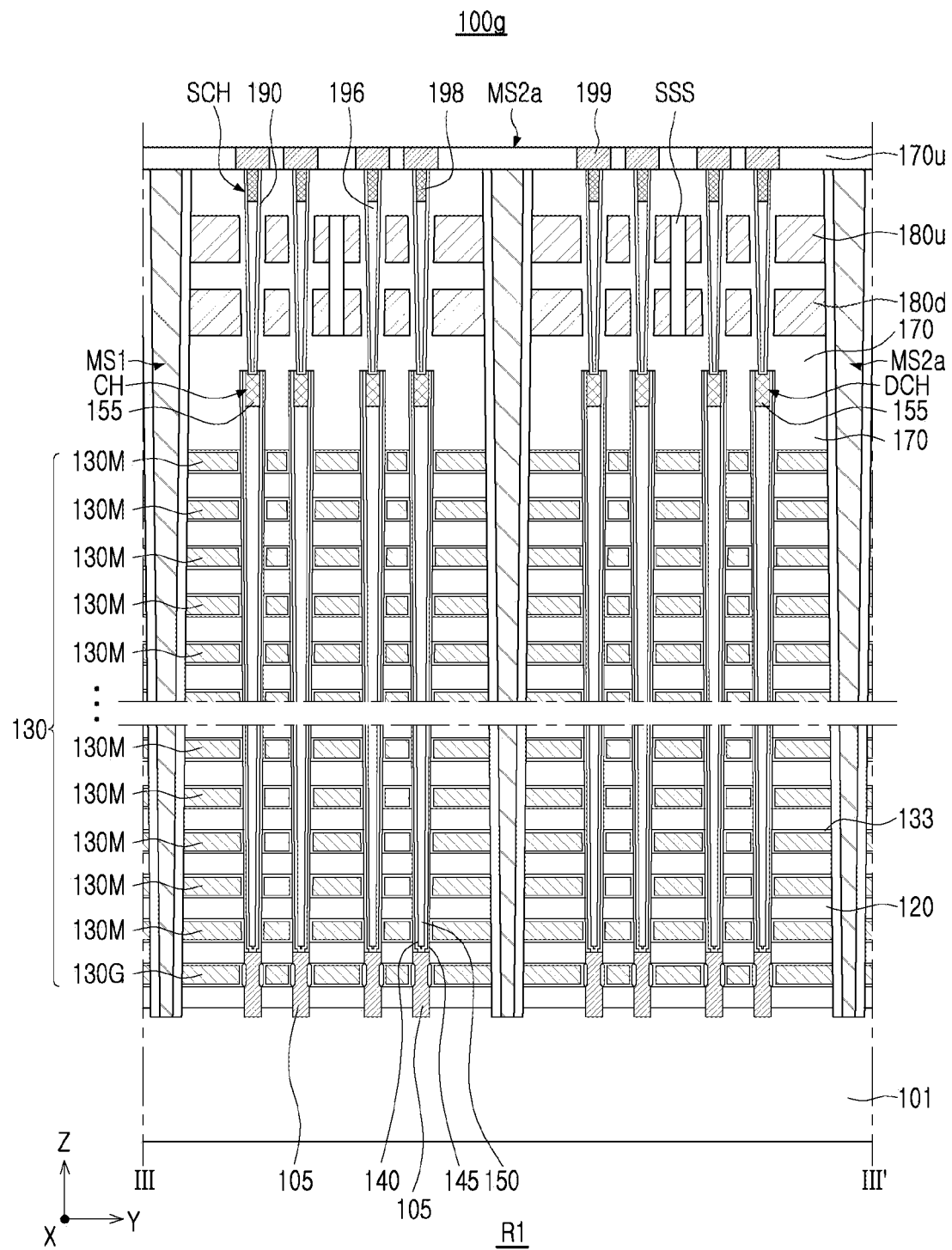

Referring to FIG. 7D, a semiconductor device 100g may further include string select channel structures SCH on the channel structures CH, string select gate structures 180u and 180d arranged to surround a portion of sides of the string select channel structures SCH, a pad portion 199 on the string select channel structures SCH, and an upper cell region insulating layer 170u. The string select channel structures SCH may include a string select channel layer 190, a string select channel insulating layer 196 inside the string select channel layer 190, and/or string select channel pads 198 covering an upper surface of the string select channel insulating layer 196 and connected to the string select channel layer 190.

The string select gate structures 180u and 180d may be disposed on the channel structures CH. The string select gate structures 180u and 180d constituting the string select line may extend in the x direction and may be separated from each other at regular intervals in the y direction by the string gate separation region SSS. The string select gate structures 180u and 180d may be separated from each other in the y direction also by the first and second separation regions MS1, MS2a, and MS2b. The string select gate structures 180u and 180d are gate electrodes of the string select transistors and may correspond to the string select lines SSL0 to SSL2 of FIG. 2. The string gate separation region SSS may be in the form of a line or a rectangle extending in the x direction, but may also be arranged in a zigzag form in one direction. The string select gate structures 180u and 180d may include a semiconductor material such as polycrystalline silicon or monocrystalline silicon, and the semiconductor material may be an undoped material or a material containing p-type or n-type impurities. The number of string gate electrode layers forming the string select gate structures 180u and 180d may be 1 or 2 or more and may have a structure different from the gate electrodes 130 of the memory cells M.

In some example embodiments, the string select gate structures 180u and 180d may include the string select gate electrode 180d and an erase gate electrodes 180u forming an erase transistor used in an erase operation using a gate induced leakage current (GIDL) phenomenon, but is not limited thereto.

The string select channel structures SCH may be arranged to be spaced apart from each other, while forming rows and columns on the stacked structure of the gate electrodes 130 and may be arranged to overlap the channel structures CH. The string select channel structures SCH may be arranged to form a lattice pattern or may be arranged in a zigzag form in one direction. The string select channel structures SCH may have a column shape and may have an inclined side narrower toward the substrate 101 according to an aspect ratio. The string select channel structures SCH may penetrate the string select gate structures 180u and 180d. The string select channel layer 190 may be electrically insulated from the string select gate structures 180u and 180d by the cell region insulating layer 170. The string select channel structures SCH may have a maximum diameter smaller than a maximum diameter of the channel structures CH, but are not limited thereto.

FIGS. 8A to 8D are cross-sectional views illustrating an example of a method for forming a semiconductor device according to some example embodiments in the present disclosure.

Figure 8A:
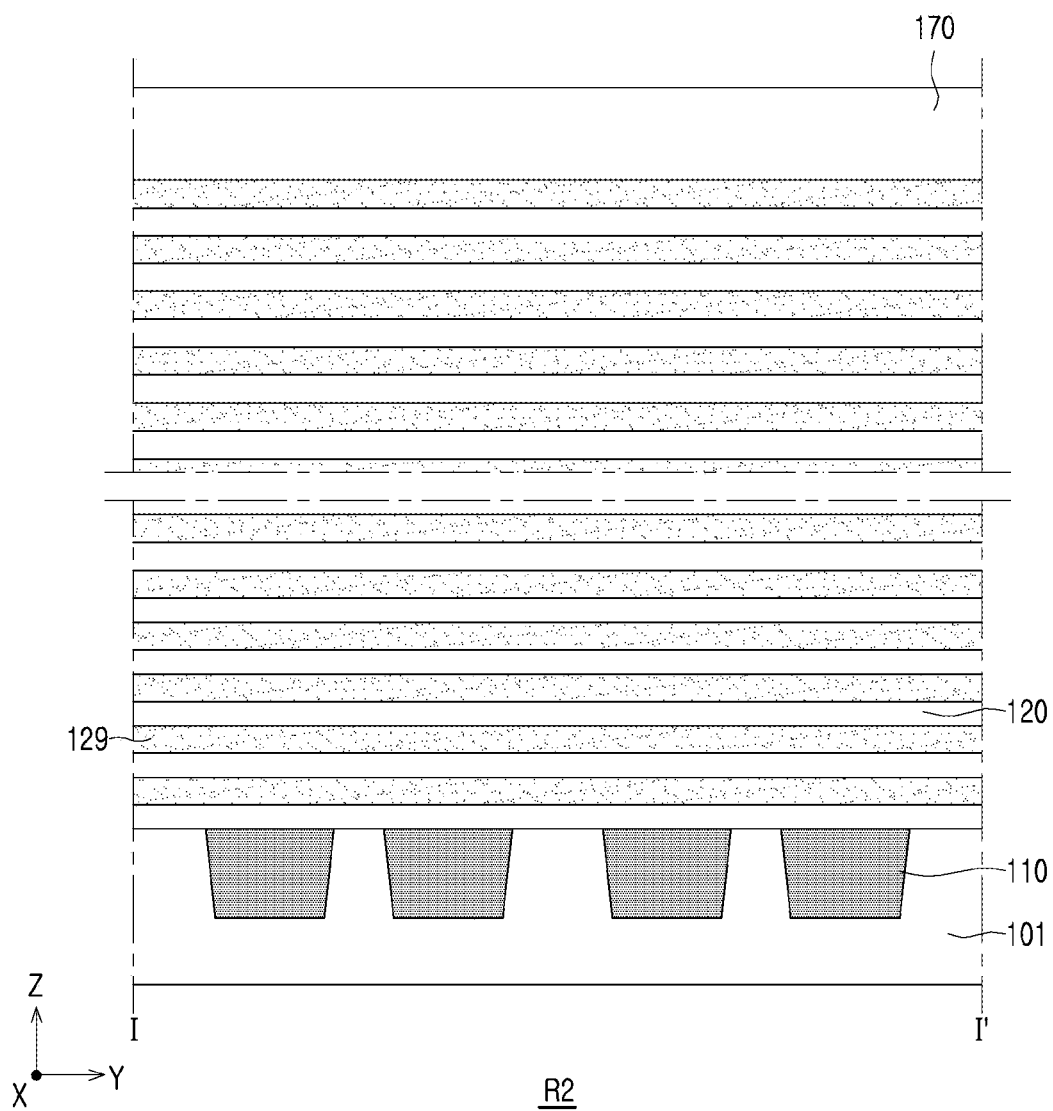
FIG. 8A to 8D are cross-sectional views illustrating an example of a method of forming a semiconductor device according to example embodiments in the present disclosure.

Referring to FIG. 8A, in the second region R2, the substrate insulating layer 110 may be formed in the substrate 101.

A portion of the substrate may be anisotropically etched to form trench regions. The trench regions may a width narrower downward by an aspect ratio. Next, the trench regions may be filled with an insulating material, and a process of planarizing an upper surface of the substrate 101 may be performed.

The substrate insulating layer 110 may be formed in the second region R2 of the substrate 101, except for regions in which the first and second separation regions MS1, MS2a, and MS2b are located. The substrate insulating layer 110 may be formed in the second region R2 of the substrate 101 such that the respective second separation regions MS2a and MS2b overlap regions, which are spaced apart from each other in the x direction, in the z direction.

The sacrificial layers 129 and the interlayer insulating layers 120 may be alternately stacked on the substrate 101. Portions of the sacrificial layers 129 and the interlayer insulating layers 120 may be removed so that the sacrificial layers 129 extend by different lengths in the x direction.

The sacrificial layers 129 may be layers that are replaced with gate electrodes 130 through a follow-up process. The sacrificial layers 129 may be formed of a material that may be etched with etch selectivity with respect to the interlayer insulating layers 120. For example, the interlayer insulating layer 120 may be formed of at least one of silicon oxide and silicon nitride, and the sacrificial layers 129 may be formed of a material different from the interlayer insulating layer 120 selected from among silicon, silicon oxide, silicon carbide, and silicon nitride. In some example embodiments, thicknesses of the interlayer insulating layers 120 may not be the same. For example, the lowermost interlayer insulating layer 120 may be formed relatively thin, and the uppermost interlayer insulating layer 120 may be formed relatively thick. The thicknesses and the number of the interlayer insulating layers 120 and the sacrificial layers 129 may be variously changed from those illustrated.

In the second region R2, a photolithography process and an etching process may be repeatedly performed on the sacrificial layers 129 such that the upper sacrificial layers 129 extend shorter than the lower sacrificial layers 129. Accordingly, the sacrificial layers 129 may have a step shape. According to some example embodiments, a material forming the sacrificial layers 129 may be further deposited in regions where the sacrificial layers 129 are elongated to be longer than the upper sacrificial layers 129 and exposed, so that the sacrificial layers 129 may be formed to have a relatively thick thickness at the end.

In the process of forming the sacrificial layers 129 and the interlayer insulating layers 120, after the lowermost sacrificial layer 129 is formed, a patterning process and a deposition process of an insulating material may be performed to form a lower separation region GS (see FIG. 4E) including a lower insulating layer 160. The lower insulating layer 160 may be formed of a material having etch selectivity with respect to the sacrificial layers 129.

Figure 8B:
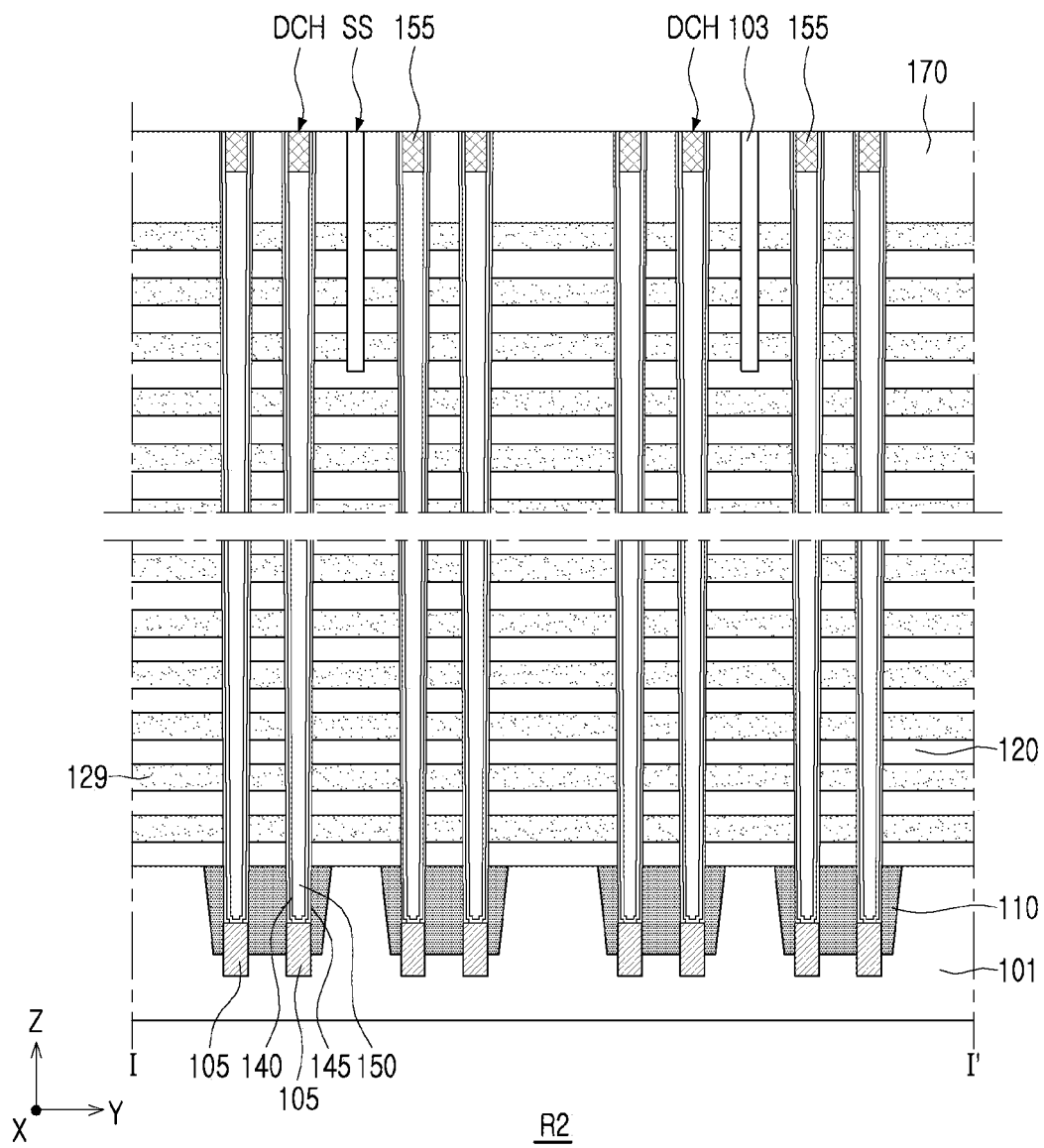

Referring to FIG. 8B, an upper separation region SS may be formed, a cell region insulating layer 170 covering the stacked structure of the sacrificial layers 129 and the interlayer insulating layers 120 is formed, and the channel structure CH and the dummy channel structures DCH penetrating the stacked structure of the sacrificial layers 129 and the interlayer insulating layers 120 may be formed.

After the sacrificial layers 129 and the interlayer insulating layers 120 are alternately stacked, a region in which the upper separation region SS is to be formed may be exposed using a separate mask layer, and a predetermined or alternatively, desired number of sacrificial layers 129 and the interlayer insulating layers 120 may be removed from the uppermost portion. The upper separation region SS may extend below with respect to the region in which the string select gate electrodes 130Su and 130Sd are formed as shown in FIG. 4C. An insulating material may be deposited in the region from which the sacrificial layers 129 and the interlayer insulating layers 120 were removed, to form the upper insulating layer 103. The upper insulating layer 103 may be formed of a material having etch selectivity with respect to the sacrificial layers 129 and may be formed of the same material as the interlayer insulating layer 120, for example.

The cell region insulating layer 160 may be formed to cover a portion of an upper surface of the substrate 101, an upper surface of the uppermost sacrificial layer 129 in the first region R1, and upper surfaces of the sacrificial layers forming a step shape in the second region R2.

The channel structures CH and/or the dummy channel structures DCH may be formed by anisotropically etching the sacrificial layers 129 and the interlayer insulating layers 120 and may be formed in a hole shape. Due to a height of the stacked structure, sidewalls of the channel structures CH and the dummy channel structures DCH may not be perpendicular to an upper surface of the substrate 101. The channel structures CH may be formed in the first region R1 of the substrate 101 and the dummy channel structures DCH may be formed in the second region R2. The dummy channel structures DCH may be formed to penetrate at least a portion of the substrate insulating layer 110. In some example embodiments, the channel structures CH and dummy channel structures DCH may be formed to access a portion of the substrate 101. However, according to some example embodiments, the dummy channel structures DCH may not completely penetrate the substrate insulating layer 110 but extend only into the substrate insulating layer 110 so as not to be in contact with the substrate 101.

In the channel structures CH and dummy channel structures DCH, the epitaxial layer 105, at least a portion of the gate dielectric layer 145, the channel layer 140, the channel insulating layer 150, and/or the channel pads 155 may be formed. In addition to the dummy channel structures DCH, when the dummy channel structures are further arranged in the first region R1 together with the channel structures CH, the dummy channel structures may also be formed together with the channel structures CH in this process.

The epitaxial layer 105 may be formed using selective epitaxial growth (SEG). The epitaxial layer 105 may be formed of a single layer or a plurality of layers. The epitaxial layer 105 may include polycrystalline silicon, monocrystalline silicon, polycrystalline germanium, or monocrystalline germanium doped with or without impurities. In the dummy channel structures DCH, the epitaxial layers 105 may be formed such that an upper end thereof is located in the substrate insulating layer 110 and at least a portion of a side surface is surrounded by the substrate insulating layer 110. Accordingly, the epitaxial layers 105 are located to be spaced apart from the sacrificial layers 129 in the dummy channel structures DCH.

The gate dielectric layer 145 may be formed to have a uniform thickness using atomic layer deposition (ALD) or chemical vapor deposition (CVD). In this process, all or some of the gate dielectric layer 145 may be formed, and a portion extending vertically to the substrate 101 along the channel structures CH and the dummy channel structures DCH may be formed in this process. The channel layer 140 may be formed on the gate dielectric layer 145 in the channel structures CH and the dummy channel structures DCH. The channel insulating layer 150 is formed to fill the channel structures CH and the dummy channel structures DCH and may be an insulating material. However, according to some example embodiments, the portion between the channel layers 140 may be filled with a conductive material, rather than the channel insulating layer 150. The channel pad 155 may be formed of a conductive material, for example, polycrystalline silicon.

Figure 8C:
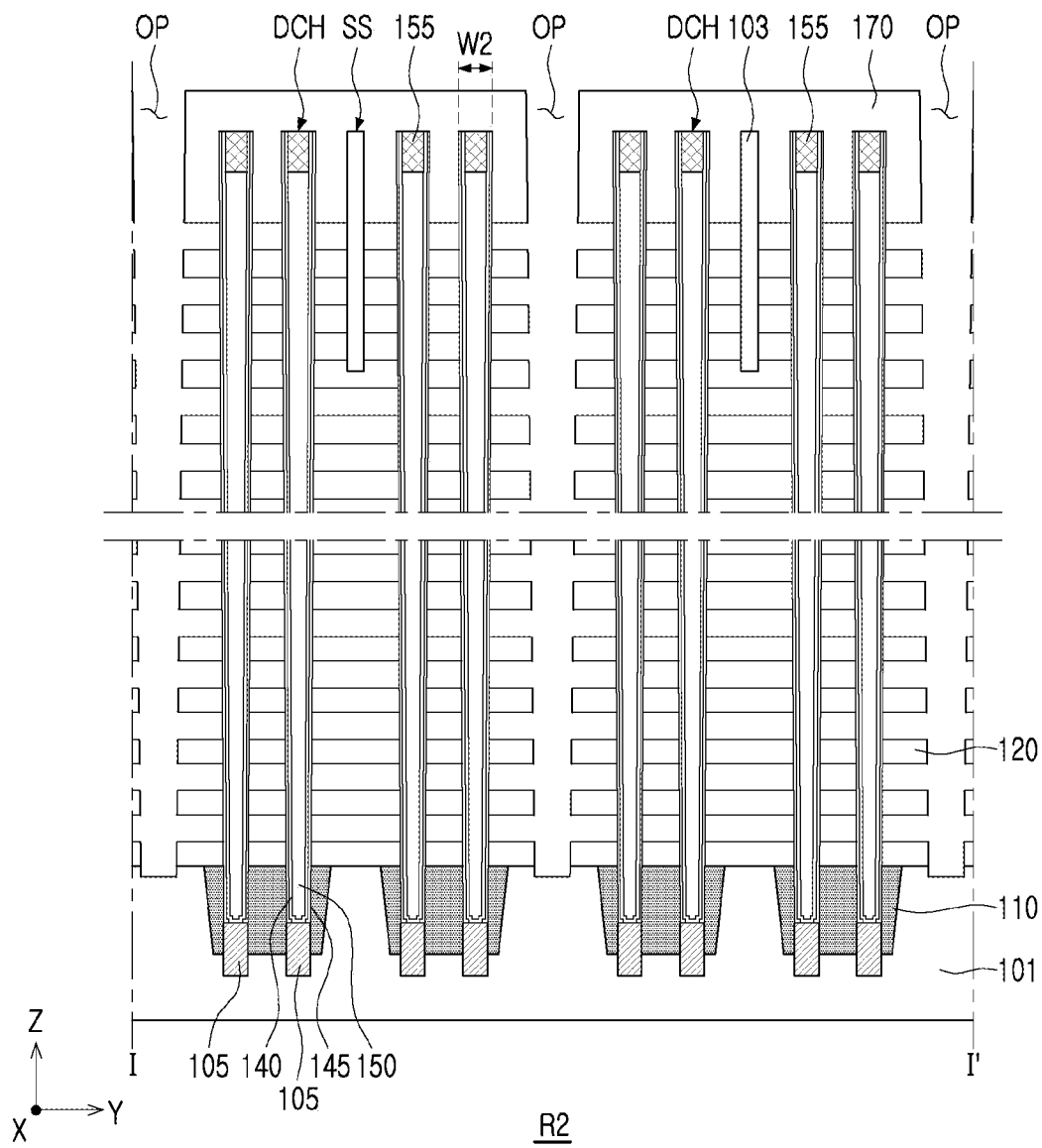

Referring to FIG. 8C, openings OP penetrating the stacked structure of the sacrificial layers 129 and the interlayer insulating layers 120 are formed, and the sacrificial layers 129 may be removed through the openings OP.

The openings OP may be formed by forming a mask layer using a photolithography process and anisotropically etching the stacked structure. Before forming the openings OP, a cell region insulating layer 170 may be additionally formed on the channel structures CH and the dummy channel structures DCH to protect lower structures. The openings OP may be formed in a trench shape at positions corresponding to the first and second separation regions MS1, MS2a, and MS2b. Accordingly, the openings OP may be formed to extend in the x direction, some of the openings OP may extend along the entire first and second regions R1 and R2, and the other of the openings OP may extend only in the second region R2. In this process, the substrate 101 may be exposed at a lower portion of the openings OP.

The sacrificial layers 129 may be selectively removed with respect to the interlayer insulating layers 120 using, for example, wet etching. Accordingly, a plurality of side openings may be formed between the interlayer insulating layers 120, and some sidewalls of the gate dielectric layer 145 of the channel structures CH and side surfaces of the interlayer insulating layer 120 may be exposed through the side openings. In this operation, after the sacrificial layers 129 are removed, the stacked structure of the interlayer insulating layer 120 may have lower stability, but the stacked structure may be more stably supported by the regions where the openings OP are spaced apart from each other and the dummy channel structures DCH.

Figure 8D:
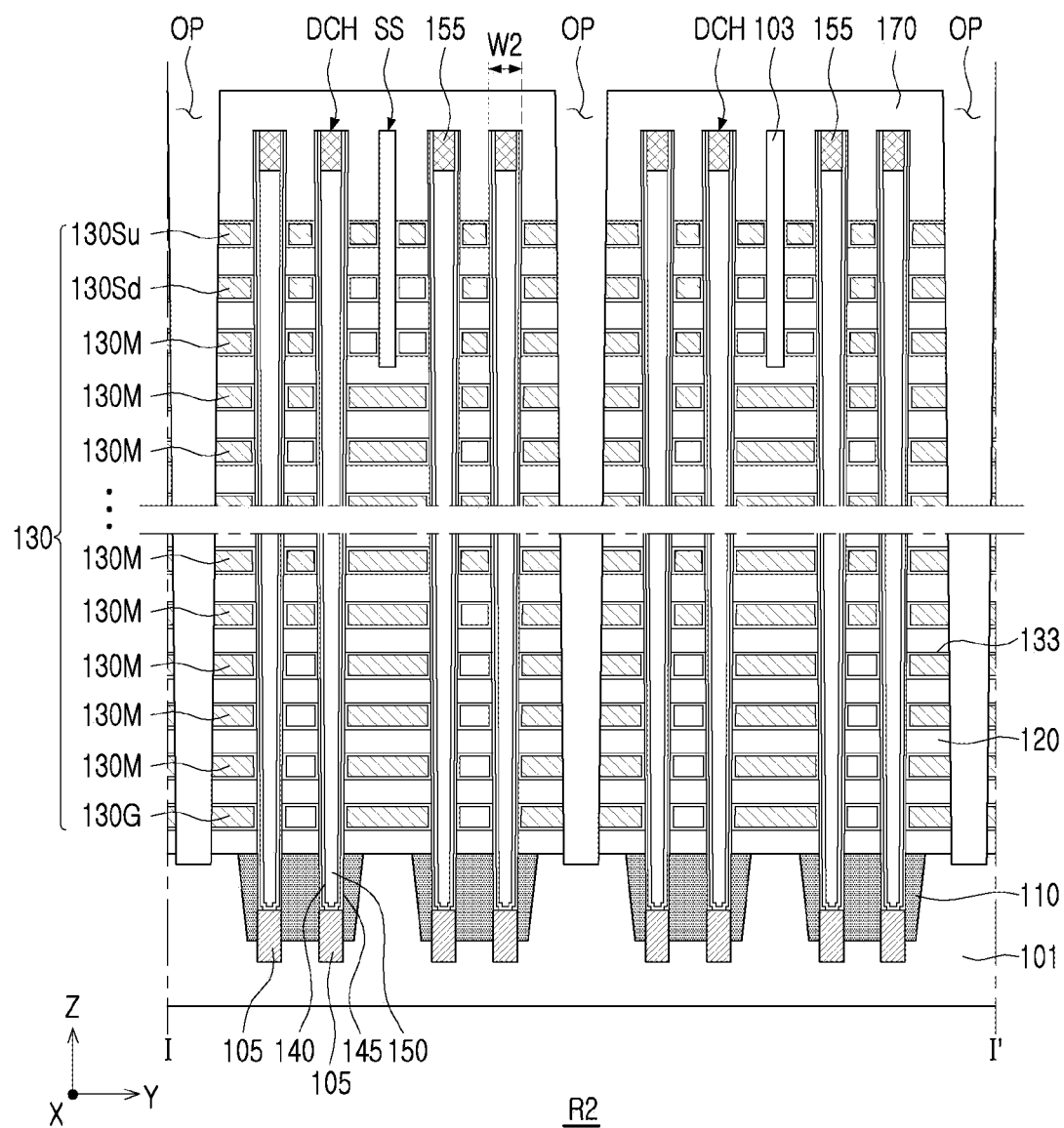

Referring to FIG. 8D, the gate electrodes 130 may be formed by filling the region, from which the sacrificial layers 129 were removed, with a conductive material. The diffusion barrier 133 may be formed in the region, from which the sacrificial layers were removed, before forming the gate electrodes 130.

The gate electrodes 130 may include a metal, polycrystalline silicon, or a metal silicide material. The openings OP may provide a transfer path of a material for forming the gate electrodes 130. The gate electrodes 130 may be connected to each other, rather than being separated from each other, to form gate connecting portions between the openings OP spaced apart from each other and aligned in the x direction,. After forming the gate electrodes 130, a material forming the gate electrodes 130 deposited in the openings OP may be removed through an additional process.

Next, referring to FIGS. 3B and 4A together, the separation insulating layer 107 and the conductive layer 109 may be formed in the openings OP.

The separation insulating layer 107 may include an insulating material, and the conductive layer 109 may also include a conductive material. Accordingly, the first and second separation regions MS1, MS2a, and MS2b may be formed, and the first and second separation regions MS1, MS2a, and MS2b may be formed in the same process operation to have the same structure with each other.

Thereafter, an upper wiring structure such as channel contact plugs 157 and bit lines may be further formed on the channel structures CH.

As set forth above, according to some example embodiments in the present disclosure, by arranging the separation regions to be spaced apart from the dummy channel structure by a predetermined or alternatively, desired distance, a defect of a pattern in which the separation region is bent or protrudes toward the dummy channel structure may be reduced or minimized Thus, a defect due to deposition of a conductive residue near the gate electrode adjacent to the lower portion of the separation region may be reduced or prevented.

While example embodiments have been shown and described above, it will be apparent to those skilled in the art that modifications and variations could be made without departing from the scope of the present disclosure as defined by the appended claims.

What is claimed is:

1. A semiconductor device comprising:
a substrate having a first region and a second region;
a plurality of gate electrodes stacked and spaced apart from each other in a first direction, perpendicular to an upper surface of the substrate in the first region and including a plurality of pad regions provided by some of the plurality of gate electrodes extending in different lengths along a second direction, perpendicular to the first direction in the second region;
a plurality of first separation regions penetrating the plurality of gate electrodes in the first and second regions, extending in the second direction, and spaced apart from each other in a third direction, perpendicular to the first and second directions;
a plurality of second separation regions penetrating the plurality of gate electrodes between the plurality of first separation regions and including second main separation regions extending in the second direction, from the first region, and second auxiliary separation regions extending in the second direction, from the second region;
a plurality of channel structures penetrating the plurality of gate electrodes, extending vertically on the substrate, and arranged in the first region; and
a plurality of dummy channel structures penetrating the plurality of gate electrodes, extending vertically on the substrate, and arranged in the second region,
wherein the plurality of pad regions include first pad regions provided by an uppermost first gate electrode among the plurality of gate electrodes and second pad regions provided by a second gate electrode below the uppermost first gate electrode,
the plurality of dummy channel structures include a pair of first dummy channel structures penetrating the first pad regions and arranged adjacent to the first region and a pair of second dummy channel structures arranged adjacent to a first end of the uppermost first gate electrode,
the second auxiliary separation regions are arranged between the first pad regions adjacent to each other and have a first edge portion adjacent to the first dummy channels structure and a first end point closest to the first region on the first edge portion,
a central axis of each of the first dummy channel structures is spaced apart from a central axis of each of the second dummy channel structures by a first distance in the second direction, and
the first edge portion of each of the second auxiliary separation regions is spaced apart from a central axis of each of the first dummy channel structures by a second distance, smaller than the first distance, in a fourth direction, diagonal to the second direction.

2. The semiconductor device of claim 1, wherein the second distance is greater than one-third the first distance.

3. The semiconductor device of claim 2, wherein the second pad region has a first length in the second direction, and the second distance is smaller than the first length.

4. The semiconductor device of claim 1, wherein a distance between the first end point of each of the second auxiliary separation regions and the first end is smaller than a distance between each of the first dummy channel structures and the first end.

5. The semiconductor device of claim 1, wherein the second distance is about 150 nm to about 400 nm.

6. The semiconductor device of claim 1, wherein a minimum distance between the first end point of each of the second auxiliary separation regions and each of the first dummy channel structures is about 200 nm to 500 nm.

7. The semiconductor device of claim 1, further comprising:
an upper separation region penetrating at least one gate electrode including the uppermost first gate electrode between the plurality of first separation regions and in contact with the first end point of each of the second auxiliary separation regions.

8. The semiconductor device of claim 1, further comprising:
a substrate insulating layer in the substrate between the first separation regions and the second separation regions in the second region,
wherein the substrate insulating layer is between the plurality of first separation regions and the plurality of second separation regions so as not to overlap the plurality of first separation regions and the plurality of second separation regions in the first direction.

9. The semiconductor device of claim 8, wherein
each of the second auxiliary separation regions has a first lower end point longer from the first region than the first end point on a plane of a level between a lower end and an upper end of the substrate insulating layer and
the first lower end point of each of the second auxiliary separation regions is spaced apart from the central axis of each of the first dummy channel structures by a third distance greater than the second distance in the fourth direction.

10. The semiconductor device of claim 1, wherein
each of the plurality of first separation regions and each of the plurality of second separation regions includes a conductive layer including a conductive material and an separation insulating layer covering side surfaces of the conductive layer, and
a structure of a cross section in the third direction of the plurality of first separation regions is substantially the same as a structure of a cross-section in the third direction of the second auxiliary separation regions.

11. The semiconductor device of claim 1, wherein
each of the second auxiliary separation regions has a portion in which a side surface in the second direction from a planar view, and the portion of each of the second auxiliary separation regions extends by the first distance or greater.

12. The semiconductor device of claim 1, wherein
the plurality of pad regions include lower pad regions, one or a plurality of intermediate pad regions on the lower pad region, and dummy pad regions and upper pad regions on the one or the plurality of intermediate pad regions,
the one or the plurality of intermediate pad regions have a step structure lowered in the second direction and lowered in the third direction, and
the dummy pad regions have a step structure of at least five steps in each of the second direction and the third direction.

13. The semiconductor device of claim 1, further comprising:
a first contact plug connected to the first pad regions in the second region and between the pair of first dummy channel structures and the pair of second dummy channel structures, and
the first end point of each of the second auxiliary separation regions is closer to the first end than the first contact plug.

14. The semiconductor device of claim 1, wherein
the pad regions further include a third pad region provided by a third gate electrode below the second gate electrode including the second pad region,
the plurality of dummy channel structures further include a third dummy channel structure on the third pad region,
each of the second auxiliary separation regions has a second end point located opposite to the first end point in the second direction, and
a second end point of each of the second auxiliary separation regions is spaced apart from the first region in the second direction from a central axis of the third dummy channel structure.

15. A semiconductor device comprising:

a substrate having a first region and second region;

gate electrodes stacked and spaced apart from each other in a first direction, perpendicular to an upper surface of the substrate in the first region and including pad regions provided by some of the gate electrodes extending in a second direction, perpendicular to the first direction in the second region and having different lengths;

first separation regions penetrating the gate electrodes in the first and second regions, extending in the second direction, and spaced apart from each other in a third direction, perpendicular to the first and second directions;

second separation regions penetrating the gate electrodes in the second region and extending in the second direction; and channel structures and dummy channel structures penetrating the gate electrodes, extending vertically on the substrate, and arranged in the first region and the second region, respectively, wherein the pad regions include a first pad region and a second pad region sequentially arranged in the second direction from the first region, a first edge portion adjacent to the first region of the second separation region is spaced apart from a central axis of each of the dummy channel structures penetrating the first pad region and the central axis of each of the dummy channel structures is separated from the first edge portion by a first distance in a fourth direction, diagonal to the second direction, and the first distance is greater than a maximum width of each of the dummy channel structures.

16. The semiconductor device of claim 15, wherein the dummy channel structures penetrating the first pad region are spaced apart from each other by a second distance in the second direction, and the first distance is greater than one-third of the second distance.

17. The semiconductor device of claim 15, wherein the dummy channel structures include a pair of first dummy channel structures adjacent to the first region and a pair of second dummy channel structures adjacent to an end of the first pad region, a first extension line passing through the first edge portion in the second direction and a second extension line passing through a central axis of each of the first dummy channel structures and the first edge portion form a first angle, and the first angle is smaller than about 40°.

18. The semiconductor device of claim 15, wherein the second separation regions have a width decreasing in the second direction and the third direction toward an upper surface of the substrate, and a distance between the first edge portion of the second separation regions and each of the dummy channel structures increases toward the substrate.

19. The semiconductor device of claim 15, wherein a structure of a cross section in the third direction of the first separation regions is substantially the same as a structure of a cross section in the third direction of the second separation regions.

20. A semiconductor device comprising:

a substrate having a first region and a second region;

gate electrodes stacked and spaced apart from each other in a first direction, perpendicular to an upper surface of the substrate in the first region and extending in a second direction, perpendicular to the first direction in the second region and having different lengths;

a plurality of first separation regions penetrating the gate electrodes in the first and second regions, extending in the second direction, and spaced apart from each other in a third direction, perpendicular to the first and second directions;

second separation regions penetrating the gate electrodes between the first separation regions and including second main separation regions extending in the second direction, from the first regions, and second auxiliary separation regions extending in the second direction, from the second region;

a first vertical structure penetrating the gate electrodes in the second region and closest to the first region; and an upper separation region penetrating at least one gate electrode including the uppermost first gate electrode between the plurality of first separation regions, wherein a width of the second separation regions in the third direction is greater than a width of the first vertical structure, a width of the second auxiliary separation regions in the third direction is greater than a width of the upper separation region, and a first end point of each of the second auxiliary separation regions adjacent to the first region is spaced apart from a central axis of each of the first vertical structures in the second direction, away from the first region and the upper separation region being in contact with the first end point of each of the second auxiliary separation regions.

* * * * *